(12) United States Patent
Haruta

(10) Patent No.: US 9,006,792 B2
(45) Date of Patent: Apr. 14, 2015

(54) LIGHT EMITTING DIODE ELEMENT

(71) Applicant: Mitsubishi Chemical Corporation, Chiyoda-ku (JP)

(72) Inventor: Yuki Haruta, Yokkaichi (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 13/841,751

(22) Filed: Mar. 15, 2013

(65) Prior Publication Data

US 2013/0306976 A1    Nov. 21, 2013

Related U.S. Application Data

(63) Continuation of application No. PCT/JP2012/072922, filed on Sep. 7, 2012.

(30) Foreign Application Priority Data

Sep. 12, 2011 (JP) ................. 2011-198118
Sep. 27, 2011 (JP) ................. 2011-211577
Oct. 7, 2011 (JP) ................. 2011-223416

(51) Int. Cl.
| | | |
|---|---|---|
| H01L 21/02 | (2006.01) | |
| H01L 33/36 | (2010.01) | |
| H01L 33/32 | (2010.01) | |
| H01L 33/16 | (2010.01) | |
| H01L 33/22 | (2010.01) | |
| H01L 33/38 | (2010.01) | |

(52) U.S. Cl.
CPC ............. *H01L 33/36* (2013.01); *H01L 33/32* (2013.01); *H01L 33/16* (2013.01); *H01L 33/22* (2013.01); *H01L 33/38* (2013.01)

(58) Field of Classification Search
USPC .................... 257/13, 76, 200, 615
See application file for complete search history.

(56) References Cited

U.S. PATENT DOCUMENTS

| 4,864,370 A | 9/1989 | Gaw et al. |
| 6,291,840 B1 | 9/2001 | Uemura et al. |

(Continued)

FOREIGN PATENT DOCUMENTS

| JP | 1-151274 | 6/1989 |
| JP | 7-193279 | 7/1995 |

(Continued)

OTHER PUBLICATIONS

Decision granted in corresponding Korean patent application 9-5-2014-034300551, filed May 20, 2014.

(Continued)

*Primary Examiner* — Nicholas Tobergte
(74) *Attorney, Agent, or Firm* — Oblon, McClelland, Maier & Neustadt, L.L.P.

(57) ABSTRACT

An object of the present invention is to provide a GaN-based light emitting diode element having a great emission efficiency and suitable for an excitation light source for a white LED. The GaN-based light emitting diode element includes an n-type conductive m-plane GaN substrate, a light emitting diode structure which is formed of a GaN-based semiconductor, on a front face of the m-plane GaN substrate, and an n-side ohmic electrode formed on a rear face of the m-plane GaN substrate, wherein a forward voltage is 4.0 V or less when a forward current applied to the light emitting diode element is 20 mA.

22 Claims, 24 Drawing Sheets

(56) References Cited

U.S. PATENT DOCUMENTS

| | | | |
|---|---|---|---|
| 6,551,848 B2 | 4/2003 | Kwak et al. | |
| 7,615,804 B2 * | 11/2009 | Nagahama et al. | 257/190 |
| 7,655,197 B2 * | 2/2010 | Vaudo et al. | 422/292 |
| 7,792,171 B2 * | 9/2010 | Kohda et al. | 372/45.012 |
| 8,017,932 B2 * | 9/2011 | Okamoto et al. | 257/13 |
| 8,058,639 B2 * | 11/2011 | Inoue et al. | 257/13 |
| 8,144,743 B2 * | 3/2012 | Nakagawa et al. | 372/46.01 |
| 8,269,251 B2 * | 9/2012 | Fujito et al. | 257/103 |
| 8,421,054 B2 * | 4/2013 | Iwanaga et al. | 257/11 |
| 8,422,527 B2 * | 4/2013 | Nakagawa et al. | 372/45.011 |
| 2002/0177247 A1 | 11/2002 | Kwak et al. | |
| 2003/0138981 A1 * | 7/2003 | Yamaguchi et al. | 438/22 |
| 2004/0012032 A1 | 1/2004 | Toda et al. | |
| 2009/0095973 A1 | 4/2009 | Tanaka et al. | |
| 2010/0032644 A1 | 2/2010 | Akita et al. | |
| 2012/0001223 A1 | 1/2012 | Inoue et al. | |

FOREIGN PATENT DOCUMENTS

| | | |
|---|---|---|
| JP | 10-229219 | 8/1998 |
| JP | 11-340571 | 12/1999 |
| JP | 2002-16312 | 1/2002 |
| JP | 2003-51614 | 2/2003 |
| JP | 2003-347660 | 12/2003 |
| JP | 2004-6718 | 1/2004 |
| JP | 2004-71657 | 3/2004 |
| JP | 2004-115305 | 4/2004 |
| JP | 2008-258503 | 10/2008 |
| JP | 2008-258503 A | 10/2008 |
| JP | 2009-81374 A | 4/2009 |
| JP | 2009-123969 | 6/2009 |
| WO | 2011/083551 A1 | 7/2011 |
| WO | WO 2011/083551 | 7/2011 |

OTHER PUBLICATIONS

Kuniyoshi Okamoto et al., "Disclocation-Free m-Plane InGaN Ligth-Emitting Dioded on m-Plane GaN Single Crystals", Japanese Journal of Applied Physics, vol. 45, 2006, No. 45, 2006, pp. L1197-L1199.

Mathew C. Schmidt et al., "High Power and High External Efficiency m-Plane InGaN Light Emitting Diodes", Japanese Journal of Applied Physics, vol. 46, No. 7, 2007, pp. L126-L128.

Shih-Pang et al., "Low Droop Nonpolar GaN/InGaN Light Emitting Diode Grown on m-Plane GaN Substrate", Journal of the Electrochemical Society, vol. 157, No. 5, 2010, pp. H501-H503.

Kuniyoshi Okamoto et al., "Continuous-Wave Operation of m-Plane InGaN Multiple Quantum Well Laser Diodes", Japanese Journal of Applied Physics, vol. 46, No. 9, 2007, pp. L187-L189.

International Preliminary Report on Patentability in application No. PCT/JP2012/072922, mailed on Mar. 20, 2014.

* cited by examiner

LIGHT EMITTING DIODE ELEMENT

CROSS-REFERENCE TO RELATED APPLICATION

This is a continuation of International Application PCT/JP2012/072922, filed on Sep. 7, 2012, and designated the U.S., (and claims priority from Japanese Patent Application 2011-198118 which was filed on Sep. 12, 2011, Japanese Patent Application 2011-211577 which was filed on Sep. 27, 2011, and Japanese Patent Application 2011-223416 which was filed on Oct. 7, 2011) the entire contents of which are incorporated herein by reference.

TECHNICAL FIELD

The present invention relates to a light emitting diode element, and more particularly to a GaN-based light emitting diode element that has a light emitting structure formed of a GaN-based semiconductor. A GaN-based semiconductor is a compound semiconductor represented by the general formula $Al_aIn_bGa_{1-a-b}N(0 \leq a \leq 1, 0 \leq b \leq 1, 0 \leq a+b \leq 1)$, and is also called a nitride semiconductor, a nitride-based compound semiconductor or the like.

A semiconductor light emitting element, which has a double hetero pn-junction type light emitting structure formed of a GaN-based semiconductor on an m-plane GaN substrate, is publically known (Non-patent Documents 1 to 4).

Non-patent Documents 1 to 3 disclose light emitting diode elements, and in any one of these elements, an n-side ohmic electrode is formed on an n-type Si-doped GaN layer which is formed on an m-plane GaN substrate by epitaxial growth. Non-patent Document 4 discloses a laser diode element, where an n-side ohmic electrode is formed on the rear face of an m-plane GaN substrate. The threshold current of this laser diode element is 36 mA during CW driving, and is 28 mA during pulse driving, and the threshold voltage thereof is about 7 to 8 V.

In a light emitting element, where a light emitting structure is formed on the GaN substrate, forming a good n-side ohmic electrode on a rear face of the GaN substrate is supposed to be difficult (Patent Documents 1 to 6). Therefore in the method disclosed in Patent Document 2, the contact resistance of the n-side ohmic electrode formed on the rear face of the GaN substrate is designed to be decreased by grinding the rear face to be rough using an abrasive of which particle size is 10 μm or more. In the case of the method disclosed in Patent Document 3, the rear face of the GaN substrate, for the same purpose, is processed to be rough using wet etching or dry etching. According to Patent Document 4, on the other hand, a damaged layer is formed during grinding, lapping or polishing of the rear face of the GaN substrate in order to decrease the thickness thereof, and this damaged layer interrupts forming a good ohmic electrode. Therefore in the method disclosed in Patent Document 4, the rear face of the GaN substrate after grinding is etched using dry etching or wet etching. However Patent Document 5 discloses that this purpose is not implemented by wet etching. According to a method disclosed in Patent Document 6, the rear face of the GaN substrate is dry etched so that a portion, including the crystal defects generated by mechanical polishing, is etched off, whereby the contact resistance between the GaN substrate and the n-side ohmic electrode is decreased. The knowledge and inventions disclosed in Patent Documents 1 to 6 are basically about a c-plane GaN substrate.

An electrode pad, which is formed on a surface of the element using a metal material, is essential for a light emitting diode, as a component for connecting such a power feeding member as a metal wire, a metal bump or solder. The electrode pad does not transmit light, which decreases the emission efficiency of the light emitting diode, of which current flowing through the light emitting structure concentrates on a shadow area of the electrode pad when viewed from the light extracting direction. This is because the light generated in this area is blocked and absorbed by the electrode pad, and cannot be efficiently extracted to outside the element. In order to prevent concentration of the current in this area, a high resistance film (insulating film) or a high resistance area is disposed as a current block structure between the electrode pad and the light emitting structure, so as to control the path of the current that flows through the element (Patent Documents 7 to 9).

[Patent Document 1] Japanese Patent Application Laid-Open No. H11-340571
[Patent Document 2] Japanese Patent Application Laid-Open No. 2002-16312
[Patent Document 3] Japanese Patent Application Laid-Open No. 2004-71657
[Patent Document 4] Japanese Patent Application Laid-Open No. 2003-51614
[Patent Document 5] Japanese Patent Application Laid-Open No. 2003-347660
[Patent Document 6] Japanese Patent Application Laid-Open No. 2004-6718
[Patent Document 7] Japanese Patent Application Laid-Open No. H1-151274
[Patent Document 8] Japanese Patent Application Laid-Open No. H7-193279
[Patent Document 9] Japanese Patent Application Laid-Open No. 10-229219
[Non-patent Document 1] Kuniyoshi Okamoto et al, Japanese Journal of Applied Physics, Vol. 45, No. 45, 2006, pp. L1197 to L1199
[Non-patent Document 2] Mathew C. Schmidt et al, Japanese Journal of Applied Physics, Vol. 46, No. 7, 2007, pp. L126 to L128
[Non-patent Document 3] Shih-Pang Chang et al, Journal of The Electrochemical Society, 157, (5) H501-H503 (2010)
[Non-patent Document 4] Kuniyoshi Okamoto et al, Japanese Journal of Applied Physics, Vol. 46, No. 9, 2007, pp. L187 to L189

A GaN-based light emitting diode element, where a light emitting structure is formed on an m-plane GaN substrate, does not generate QCSE (Quantum-Confined Stark Effect), and is therefore suitable for an excitation light source for white LED which is demanded that the emission wavelength does not fluctuate much when the applied current increases. However, if a calorific value of the light emitting diode element is high, or if heat dissipation thereof is not good, the temperature of the phosphor greatly changes because of the heat emitted by the light emitting diode element, and the expected effect cannot be implemented. Further, in the case of a light emitting diode element of which calorific value is high and heat dissipation is poor, the emission efficiency is low because the temperature of the light emitting diode element itself greatly increases as the applied current increases.

DISCLOSURE OF THE INVENTION

With the foregoing in view, it is a main object of the present invention to provide a GaN-based light emitting diode element suitable for an excitation light source for a white LED.

It is another object of the present invention to provide a GaN-based light emitting diode element which includes an n-side electrode formed on the rear face of an m-plane GaN substrate so as to improve emission efficiency.

It is still another object of the present invention to provide a method for manufacturing a GaN-based light emitting diode element having an n-side electrode having low contact resistance, which is formed on the rear face of an m-plane GaN substrate.

According to an aspect of the present invention, the following GaN-based light emitting diode elements are provided.

(1) A GaN-based light emitting diode element comprising: an n-type conductive m-plane GaN substrate; a light emitting diode structure which is formed of a GaN-based semiconductor, on a front face of the m-plane GaN substrate; and an n-side ohmic electrode formed on a rear face of the m-plane GaN substrate, wherein a forward voltage is 4.0 V or less when a forward current applied to the light emitting diode element is 20 mA.

(2) A GaN-based light emitting diode element comprising: an n-type conductive m-plane GaN substrate; a light emitting diode structure which is formed of a GaN-based semiconductor, on a front face of the m-plane GaN substrate; and an n-side ohmic electrode formed on a rear face of the m-plane GaN substrate, wherein a forward voltage is 4.5 V or less when a forward current applied to the light emitting diode element is 60 mA.

(3) A GaN-based light emitting diode element comprising: an n-type conductive m-plane GaN substrate; a light emitting diode structure which is formed of a GaN-based semiconductor, on a front face of the m-plane GaN substrate; and an n-side ohmic electrode formed on a rear face of the m-plane GaN substrate, wherein a forward voltage is 5.0 V or less when a forward current applied to the light emitting diode element is 120 mA.

(4) A GaN-based light emitting diode element comprising: an n-type conductive m-plane GaN substrate; a light emitting diode structure which is formed of a GaN-based semiconductor, on a front face of the m-plane GaN substrate; and an n-side ohmic electrode formed on a rear face of the m-plane GaN substrate, wherein a forward voltage is 5.5 V or less when a forward current applied to the light emitting diode element is 200 mA.

(5) A GaN-based light emitting diode element comprising: an n-type conductive m-plane GaN substrate; a light emitting diode structure which is formed of a GaN-based semiconductor, on a front face of the m-plane GaN substrate; and an n-side ohmic electrode formed on a rear face of the m-plane GaN substrate, wherein a forward voltage is 6.0 V or less when forward current applied to the light emitting diode element is 350 mA.

(6) The GaN-based light emitting diode element according to any one of (1) to (5), wherein the light emitting diode structure comprises an active layer formed of a GaN-based semiconductor, an n-type GaN-based semiconductor layer disposed between the active layer and the m-plane GaN substrate, and a p-type GaN-based semiconductor layer which sandwiches the active layer with the n-type GaN-based semiconductor layer.

(7) The GaN-based light emitting diode element according to any one of (1) to (6), wherein an area of the rear face of the m-plane GaN substrate is 0.0012 $cm^2$ or more.

(8) The GaN-based light emitting diode element according to (7), wherein an area of the n-side ohmic electrode is 0.0012 $cm^2$ or more, and equal to or less than the area of the rear face of the m-plane GaN substrate.

(9) The GaN-based light emitting diode element according to any one of (1) to (8), wherein an arithmetic mean roughness Ra in a range of 10 μm squares at least in a portion contacting the n-side ohmic electrode in the rear face of the m-plane GaN substrate is 0.1 nm or less.

(10) The GaN-based light emitting diode element according to any one of (1) to (9) wherein the n-side ohmic electrode is patterned.

According to another aspect of the present invention, the following GaN-based light emitting diode elements are provided.

(11) A GaN-based light emitting diode element comprising: an n-type conductive m-plane GaN substrate; an epi-layer which is formed of a GaN-based semiconductor epitaxially grown on the substrate and includes a pn-junction type light emitting structure; an n-side electrode formed on a rear face of the substrate; a translucent p-side ohmic electrode formed on a top face of the epi-layer; and a p-side electrode pad formed on a part of the p-side ohmic electrode, wherein an area covered by the n-side electrode, out of the rear face of the substrate, includes a low contact resistance area which is a polished area and a high contact resistance area which is a dry-etched area, and all or a part of the orthogonal projection of the p-side electrode pad to the rear face of the substrate is included in the high contact resistance area.

(12) The GaN-based light emitting element according to (11), wherein an auxiliary electrode connected to the p-side electrode pad is formed on the p-side ohmic electrode, and all or a part of the orthogonal projection of the auxiliary electrode to the rear face of the substrate is not included in the high contact resistance area.

(13) A GaN-based light emitting diode element comprising: an n-type conductive m-plane GaN substrate; an epi-layer which is formed of a GaN-based semiconductor epitaxially grown on the substrate and includes a pn-junction type light emitting structure; a translucent n-side ohmic electrode formed on a rear face of the substrate; an n-side electrode pad formed on a part of the n-side ohmic electrode; and a p-side electrode formed on a top face of the epi-layer, wherein an area covered by the n-side ohmic electrode, out of the rear face of the substrate, includes a low contact resistance area which is a polished area and a high contact resistance area which is a dry-etched area, and all or a part of the orthogonal projection of the n-side electrode pad to the rear face of the substrate is included in the high contact resistance area.

(14) The GaN-based light emitting diode element according to (13), wherein an auxiliary electrode connected to the n-side electrode pad is formed on the n-side ohmic electrode, and all or a part of the orthogonal projection of the auxiliary electrode to the rear face of the substrate is not included in the high contact resistance area.

(15) A GaN-based light emitting diode element comprising: an n-type conductive m-plane GaN substrate; an epi-layer which is formed of a GaN-based semiconductor epitaxially grown on the substrate, and includes a pn-junction type light emitting structure; an n-side electrode partially formed on a rear face of the substrate; and a p-side electrode formed on a top face of the epi-layer, wherein the n-side electrode further includes a pad portion and an auxiliary portion connected to the pad portion, an area covered by the n-side electrode, out of the rear face of the substrate, includes a low contact resistance area which is a polished area and a high contact resistance area which is a dry-etched area, and all or a part of the orthogonal projection of the pad portion to the rear face of the substrate is included in the high contact resistance area.

(16) The GaN-based light emitting diode element according to (15), wherein all or a part of the orthogonal projection of the auxiliary portion to the rear face of the substrate is not included in the high contact resistance area.

(17) The GaN-based light emitting diode element according to any one of (13) to (16), wherein a carrier concentration of the substrate is $10^{17}$ cm$^{-3}$.

According to still another aspect of the present invention, the following methods for manufacturing a GaN-based light emitting diode element are provided.

(18) A method for manufacturing a GaN-based light emitting diode element comprising: (i) a first step of preparing an epi-wafer having an n-type conductive m-plane GaN substrate, and an epi-layer which is formed of a GaN-based semiconductor epitaxially grown on the substrate and includes a pn-junction type light emitting structure; (ii) a second step of polishing a rear face of the substrate included in the epi-wafer; (iii) a third step of forming an n-side ohmic electrode on the entire rear face of the substrate polished in the second step; and (iv) a fourth step of etch-patterning the n-side ohmic electrode formed in the third step.

(19) The manufacturing method according to (18), further including a fifth step of processing the rear face of the substrate, exposed in the fourth step, to be rough.

(20) The manufacturing method according to (19), wherein in the fifth step, a concave-convex pattern having periodicity is formed on the rear face of the substrate exposed in the fourth step.

(21) The manufacturing method according to (19), wherein the n-side ohmic electrode is a polycrystalline transparent conductive oxide film, and a part of the n-side ohmic electrode is etched in the fourth step so that residue thereof remains on the substrate, and the rear face of the exposed substrate is processed to be rough in the fifth step, by performing dry etching using the residue as an etching mask.

(22) The manufacturing method according to (18), further including a sixth step of forming a reflection film on the rear face of the substrate exposed in the fourth step.

(23) The manufacturing method according to (22), wherein the reflection film is a dielectric reflection film.

(24) The manufacturing method according to any one of (18) to (23), wherein the rear face of the substrate to be polished in the second step is lapped immediately before the second step.

(25) The manufacturing method according to any one of (18) to (24), wherein a carrier concentration of the substrate is $10^{17}$ cm$^{-3}$.

The semiconductor light emitting element according to any one of (1) to (10) of the embodiment of the present invention has an n-side ohmic electrode formed on the rear face of the m-plane GaN substrate, and therefore can be secured to a metal electrode using solder. In other words, the semiconductor light emitting element can be mounted in a state where heat dissipation is good. Further, a forward voltage is kept low, so a colorific value is small and therefore the semiconductor light emitting element is very suitable for an excitation light source for a white LED.

In the case of the GaN-based light emitting diode element according to any one of (11) to (17) of the embodiment of the present invention, blocking or absorption of light by the electrode pad included in at least one of the n-side electrode and the p-side electrode can be suppressed by controlling the path of the current that flows through the element. Furthermore, a drop in emission efficiency due to the droop phenomena can be suppressed by controlling the path of the current that flows through the element, and equalizing the density of the current that flows through the light emitting structure.

According to the method for manufacturing a GaN-based light emitting diode element according to any one of (18) to (25) of the embodiment of the present invention, a GaN-based light emitting diode having an n-side electrode, which is formed on the rear face of the m-plane GaN substrate and has low contact resistance, can be manufactured.

BRIEF DESCRIPTION OF THE DRAWINGS

FIG. 1 is a schematic diagram depicting a structure of a GaN-based light emitting diode element which the present inventor produced experimentally;

FIG. 4 is a SEM images (photographs) of a rear face of m-plane GaN substrates on which processing e is performed;

FIG. 5 is a schematic diagram depicting a structure of a GaN-based light emitting diode element according to an embodiment of the present invention (Embodiment 1);

FIG. 6 is a schematic diagram depicting a structure of a GaN-based light emitting diode element according to an embodiment of the present invention (Embodiment 2);

FIG. 7 is a schematic diagram depicting a structure of a GaN-based light emitting diode element according to an embodiment of the present invention (Embodiment 3);

FIG. 8 is a schematic diagram depicting a structure of a GaN-based light emitting diode element according to an embodiment of the present invention (Embodiment 4);

FIG. 9 is a schematic diagram depicting a structure of a GaN-based light emitting diode element according to an embodiment of the present invention (Embodiment 5);

FIG. 10 is a schematic diagram depicting a structure of a GaN-based light emitting diode element according to an embodiment of the present invention (Embodiment 6);

FIG. 11 is a schematic diagram depicting a structure of a GaN-based light emitting diode element according to an embodiment of the present invention (Embodiment 7);

FIG. 16 is a schematic diagram depicting a structure of a GaN-based light emitting diode element according to an embodiment of the present invention (Embodiment 11);

FIG. 17 is a schematic diagram depicting a structure of a GaN-based light emitting diode element according to an embodiment of the present invention (Embodiment 12);

FIG. 18 is a schematic diagram depicting a structure of a GaN-based light emitting diode element according to an embodiment of the present invention (Embodiment 13);

FIG. 19 is a schematic diagram depicting a structure of a GaN-based light emitting diode element according to an embodiment of the present invention (Embodiment 14);

FIG. 20 is a schematic diagram depicting a structure of a GaN-based light emitting diode element according to an embodiment of the present invention (Embodiment 15);

BEST MODE FOR CARRYING OUT THE INVENTION

Results of experimental producing of GaN-based light emitting diode element (hereafter also called "LED element") and evaluation thereof by the present inventor will now be described.

1. Basic Structure of Experimentally Produced LED Element

Figure 1A:
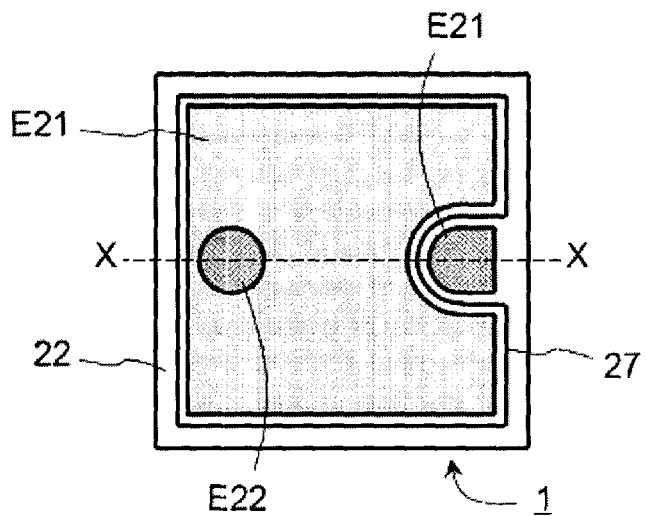
FIG. 1A is a top view of the GaN-based light emitting diode element.
Figure 1B:
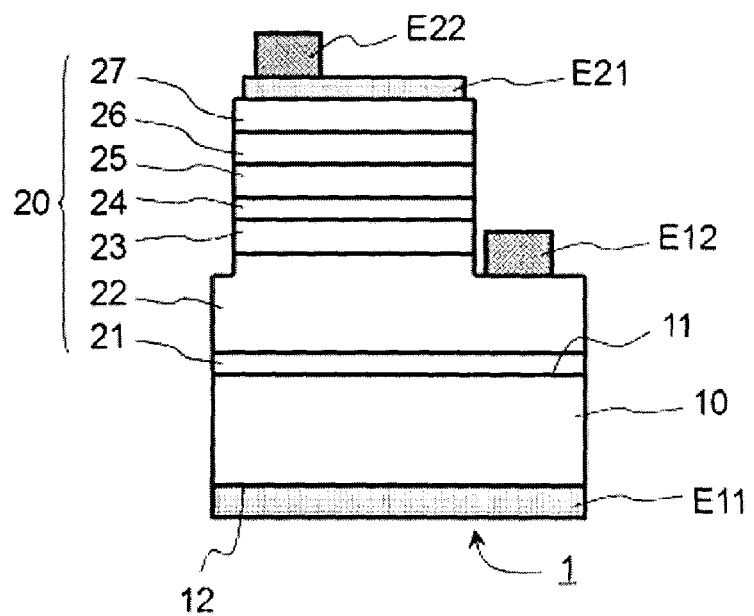
FIG. 1B is a cross-sectional view sectioned at the position of the X-X line in FIG. 1A.

FIG. 1 schematically shows a basic structure of an experimentally produced LED element. FIG. 1A is a top view, and FIG. 1B is a cross-sectional view sectioned at the position of the X-X line in FIG. 1A. As FIG. 1A shows, the plane shape of the LED element 1 is rectangular, and the size thereof is 350 μm×340 μm.

As FIG. 1B shows, the LED element 1 has a semiconductor layered body 20 formed of a GaN-based semiconductor on a substrate 10. The substrate 10 is an m-plane GaN substrate, and the semiconductor layered body 20 is disposed on a front face 11 of the substrate 10. The semiconductor layered body 20 comprises, in order from the substrate 10, a first undoped GaN layer 21, an Si-doped n-type GaN contact layer 22, a second undoped GaN layer 23, an Si-doped n-type GaN clad layer 24, an MQW active layer 25, an Mg-doped p-type $Al_{0.1}Ga_{0.9}N$ clad layer 26, and an Mg-doped p-type $Al_{0.03}Ga_{0.97}N$ contact layer 27.

The MQW active layer 25 has an undoped $In_{0.04}Ga_{0.96}N$ barrier layer and an undoped $In_{0.16}Ga_{0.84}N$ well layer, which are layered alternately. The number of the undoped InGaN barrier layers is 4, and the number of the undoped InGaN well layers is 3, that is, both the top layer and the bottom layer of the MQW active layer 25 are the barrier layers. The composition of the well layer has been adjusted so that the emission peak wavelength is confined to the range of 445 to 465 nm.

The LED element 1 has two n-side electrodes and one p-side electrode. One of the n-side electrodes is a first n-side metal pad E11, which covers the entire rear face 12 of the substrate 10. The other is a second n-side metal pad E12, formed on a surface of the n-type GaN contact layer 22, which is exposed by partially removing the semiconductor layered body 20. The first n-side metal pad E11 and the second n-side metal pad E12 both function as ohmic electrodes. The p-side electrode is constituted by an ohmic translucent electrode E21 formed on the top face of the p-type AlGaN contact layer 27, and a p-side metal pad E22 formed on a part of the translucent electrode E21. Current can be applied to the MQW active layer 25 either via the first n-side metal pad E11 and the p-side metal pad E22, or via the second n-side metal pad E12 and the p-side metal pad E22.

The first n-side metal pad E11 is a multi-layer film, and comprises, in order from the substrate 10, a TiW layer, an Au layer, a Pt layer, an Au layer, a Pt layer, an Au layer, a Pt layer and an Au layer. The second n-side metal pad E11 as well is a multi-layer film having a similar layered structure, and comprises, in order from the n-type GaN contact layer 22, a TiW layer, an Au layer, a Pt layer, an Au layer, a Pt layer, an Au layer, a Pt layer and an Au layer. The translucent electrode E21 is an ITO (Indium Tin Oxide) film. The p-side metal pad E12 is a multi-layer film having a layered stricture, similar to the first n-side metal pad E11 and the second n-side metal pad E12, and comprises, in order from the translucent electrode E21, a TiW layer, an Au layer, a Pt layer, an Au layer, a Pt layer, an Au layer, a Pt layer and an Au layer.

2. Experimental Producing of LED Element

The LED element 1 was fabricated according to the following procedure.

2-1 Epitaxial Growth

An n-type conductive m-plane GaN substrate was prepared, of which the size was 7 mm (c axis direction)×15 mm (a axis direction)×330 μm (thickness) and the off angle of the front face (principle plane on which the semiconductor layered body is disposed) was in a range of 0±0.5°, and where Si was added as an n-type impurity. The carrier concentration of the m-plane GaN substrate, checked by hole measurement, was $1.3×10^{17}$ cm$^{-3}$.

A plurality of GaN-based semiconductor layers were epitaxially grown on the front face of the m-plane GaN substrate, using a normal pressure MOVPE method, so as to form the semiconductor layered body. TMG (trimethylgallium), TMI (trimethylindium) and TMA (trimethylaluminum) were used for the group III sources, ammonia was used for the group V source, silane was used for the Si source, and bisethylcyclopentadienylmagnesium ((EtCp)$_2$Mg) was used for the Mg source.

Table 1 shows a growth temperature and film thickness of each layer.

TABLE 1

| Layer | Growth Temperature (C.°) | Film Thickness (nm) |
|---|---|---|
| First undoped GaN layer | 1040 | 10 |
| n-type GaN contact layer | 1040 | 1500 |
| Second undoped GaN layer | 800 | 200 |
| n-type GaN clad layer | 800 | 20 |
| Undoped InGaN barrier layer | 800 | 19 |
| Undoped InGaN well layer | 760 | 5 |
| p-type AlGaN clad layer | 1032 | 140 |
| p-type AlGaN contact layer | 1067 | 60 |

Table 2 shows a concentration of impurities added to the n-type GaN contact layer, the n-type GaN clad layer, the p-type AlGaN clad layer and the p-type AlGaN contact layer.

TABLE 2

| Layer | Impurity | Concentration (cm$^{-3}$) |
|---|---|---|
| n-type GaN contact layer | Si | $7 \times 10^{18}$ |
| n-type GaN clad layer | Si | $2.5 \times 10^{18}$ |
| p-type AlGaN clad layer | Mg | $3 \times 10^{19}$ |
| p-type AlGaN contact layer | Mg | $4.6 \times 10^{19}$ |

In order to activate Mg added to the p-type AlGaN clad layer and the p-type AlGaN contact layer, the flow rates of the nitrogen gas and the ammonia gas to be flown into the growth chamber were controlled while dropping the substrate temperature in the growth chamber of the MOVPE device to room temperature after the p-type AlGaN contact layer was grown for a predetermined time.

2-2 Formation of p-Side Electrode and Second n-Side Metal Pad

An ITO film was formed on the surface of the semiconductor layered body (surface of the p-type AlGaN contact layer) formed by the epitaxial growth to have a 210 nm thickness by an electron beam deposition method. Then this ITO film was patterned to be a predetermined shape using photolithography and an etching technique, so as to form a translucent electrode. After the patterning, a part of the semiconductor layered body was removed by reactive ion etching (RIE) processing, so as to expose the n-type GaN contact layer in an area where the second n-side metal pad was to be formed, and form a mesa. In the RIE processing, Cl$_2$ was used as the etching gas, and antenna/bias was set to 100 W/20 W, and the pressure inside the chamber was set to 0.3 Pa.

After the RIE processing, heat treatment was performed on the fabricated ITO film in an air atmosphere at 520° C. for 20 minutes. Then using an RTA (Rapid Thermal Annealing) device, heat treatment was performed on this ITO film in a nitrogen gas atmosphere at 500° C. for one minute.

After heat treatment was performed on the ITO film, the second n-side metal pad and the p-side metal pad were simultaneously formed to be a predetermined pattern using the liftoff method. All the layers (TiW layer, Au layer and Pt layer), included in the metal multi-layer film constituting The second n-side metal pad and the p-side metal pad, were formed by the sputtering method. In order to form the TiW film, a Ti—W target of which Ti content was 10 wt % was used for the target, and Ar (argon) was used for the sputtering gas, and the sputtering conditions were: RF power 800 W, Ar flow rate 50 sccm, and the sputtering gas pressure $2.2 \times 10^{-1}$ Pa. The thickness of the TiW layer, which was the bottom layer, and the thickness of the Au layer layered directly thereon were 108 nm, and the thickness values of all the other Pt layers and Au layers are 89 nm.

After forming the second n-side metal pad and the p-side metal pad, a passivation film formed of SiO$_2$ was formed on the exposed surface of the semiconductor layered body and the surface of the translucent electrode to be a 213 nm thickness.

2-3 Processing of Rear Face of m-Plane GaN Substrate

After forming the passivation film, six different types of processing, described below as processing a to f, were performed on the rear face of the m-plane GaN substrate.

Processing a: By sequentially performing lapping and polishing on the rear face of the m-plane GaN substrate, the thickness of the substrate was reduced to 200 μm.

In the lapping step, the particle size of a diamond abrasive grain to be used was reduced in steps according to a usual method.

In the polishing step, CMP slurry, the pH of which was adjusted to be less than 2 by adding acid to acidic colloidal silica (particle size: 70 to 100 nm), was used, and the load was adjusted so that a polishing rate becomes 0.5 μm/h, and the polishing time was approximately 14 hours. An arithmetic mean roughness Ra in a range 10 μm squares measured by AFM (e.g. DIMENSION 5000 made by Digital Instruments, Inc.) of the surface of the m-plane GaN substrate polished under these conditions is 0.1 nm or less.

The polished surface (rear face of the m-plane GaN substrate) was washed with water, and further cleaned using IPA and acetone at room temperature, and after drying, it was cleaned by ultraviolet ozone cleaning for five minutes (110° C., oxygen flow rate: 5 L/min).

Processing b: After processing a, the surface layer portion was etched off from the rear face of the m-plane GaN substrate by RIE. The RIE conditions were the same as those when RIE was performed on the semiconductor layer body in 2-2 above, and the etching time was set to 60 seconds so that the etching depth became 0.1 μm. As a result of the measurement of the surface roughness by using a stylus step gauge (ET 3000 made by Kosaka Laboratory Ltd.) after the RIE processing, an arithmetic mean roughness Ra was 0.02 μm, and a maximum height Rz was 0.04 μm.

Processing c: After processing a, the surface layer portion was further etched off from the rear face of the m-plane GaN substrate by RIE. The RIE conditions were the same as those when RIE was performed on the semiconductor layer body in 2-2 above, and the etching time was set to 610 seconds so that the etching depth became 1.0 μm. As a result of the measurement of the surface roughness by using a stylus step gauge after the RIE processing, an arithmetic mean roughness Ra was 0.06 μm, and a maximum height Rz was 0.55 μm.

Processing d: After processing a, the surface layer portion was further etched off from the rear face of the m-plane GaN substrate by RIE. The RIE conditions were the same as those when RIE was performed on the semiconductor layer body in 2-2 above, and the etching time was set to 1220 seconds so that the etching depth became 2.0 μm. As a result of the measurement of the surface roughness by using a stylus step gauge after the RIE processing, an arithmetic mean roughness Ra was 0.07 to 0.12 μm, and a maximum height Rz was 1.30 μm.

Figure 2:
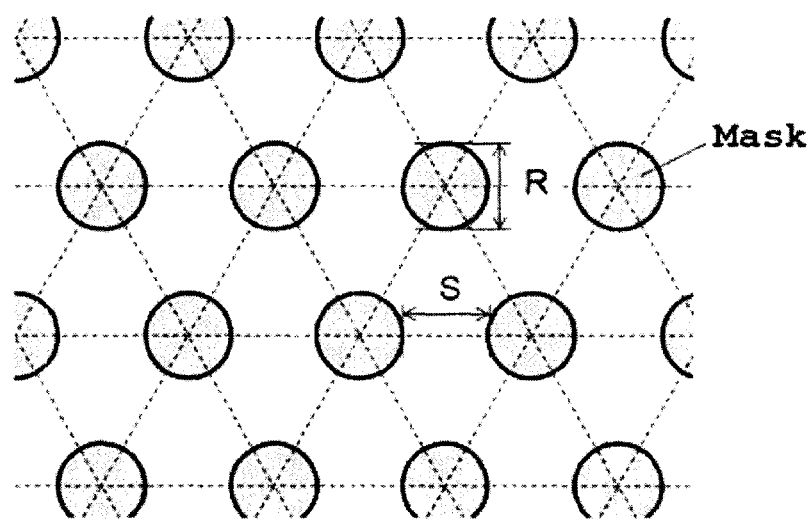
FIG. 2 is a plan view of a mask pattern.
Figure 3:
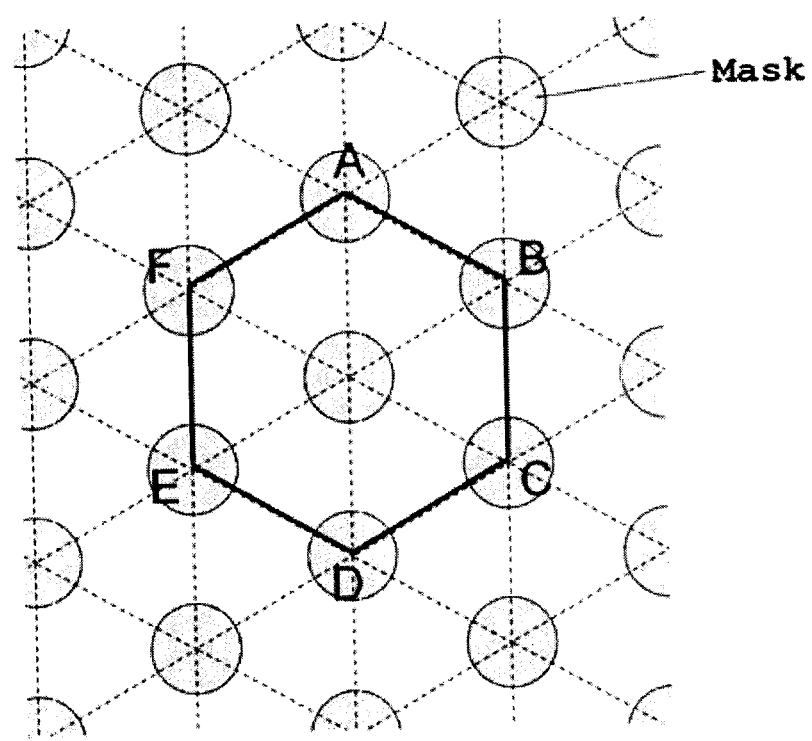
FIG. 3 is a plan view for explaining the orientation of a mask pattern.

Processing e: On the rear face of the m-plane GaN substrate after performing processing a, a positive photoresist using novolac resin (Sumiresist™ PFI-34AL made by Sumitomo Chemical Co., Ltd.) was coated to a 1.6 μm thickness, and this photoresist was patterned using a photolithography technique, whereby the mask pattern shown in FIG. 2 was formed. In other words, in this mask pattern, a plurality of circular etching masks were disposed on lattice positions of the triangular lattice. The diameter (R in FIG. 2) of each circular mask was 2 μm, and the space (S in FIG. 2) between adjacent circular masks was 2.5 μm. As FIG. 3 shows, the direction of the mask pattern was determined such that two sides, BC and EF, of the regular hexagon ABCDEF, of which vertexes were the six lattice positions of the triangular lattice, intersect the c axis of the m-plane GaN substrate orthogonally.

By performing RIE using the mask pattern formed like this as the etching mask, the rear face of the m-plane GaN substrate was processed to have a concave-convex pattern. The etching gas used here was $Cl_2$, and antenna/bias was set to 100 W/20 W, and the pressure inside the chamber was set to 0.3 Pa, so that the etching selection ratio became approximately 1. The etching selection ratio here means [etching rate of GaN]/[etching rate of mask] when the etching time was approximately 800 seconds or Less. Under these conditions, the RIE processing was performed for 1500 seconds. The mask pattern virtually disappeared when the etching time reached approximately 800 seconds. After the RIE processing, the wafer was cleaned using organic solvent, and then the ultraviolet ozone cleaning (110° C., oxygen flow rate: 5 L/sec.) was performed for five minutes, on the RIE-processed surface.

Figure 4A:
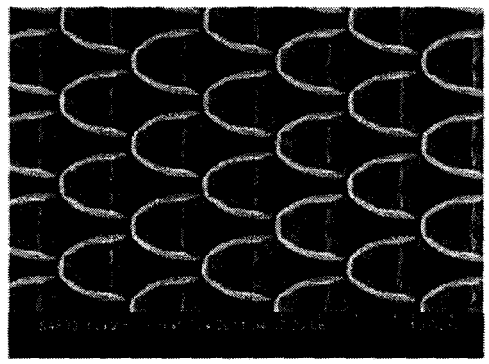
FIG. 4A is a plan view of the rear face.
Figure 4B:
FIG. 4B is a cross-sectional view of the rear face.
Figure 4C:
FIG. 4C is a perspective view of the rear face.

FIG. 4 shows SEM images of a rear face of the m-plane GaN substrate after the processing e was performed. FIG. 4A is a plan view, FIG. 4B is a cross-sectional view, and FIG. 4C is a perspective view. In all of FIG. 4A to 4C, the direction from right to left is the [0001] direction (c+ direction) of GaN, and the direction from left to right is [000-1] direction (c-direction) of GaN. The height of the protrusions formed on the rear face of the m-plane GaN substrate was 1.5 μm.

Processing f: A mask pattern was formed on the rear face of the m-plane GaN substrate after processing a was performed according to the same procedure as processing e. But in processing f, the rear face of the m-plane GaN substrate was covered by a thin sapphire plate after the m-plane GaN substrate was set in the RIE chamber, so as to protect the rear face from receiving RIE processing. Otherwise the processing f was the same as processing e. In other words, the process of forming a mask pattern using the photoresist, the process of removing the mask pattern using organic solvent, and the process of ultraviolet ozone cleaning after removing the mask pattern, were performed on the rear face of the m-plane GaN substrate in the processing f.

2-4 Formation of First n-Side Metal Pad

A metal multi-layer film to be the first n-side metal pad was formed on the rear face of the m-plane GaN substrate after one of the processings a to f was performed. All the layers included in the metal multi-layer film (TiW layer, Au layer and Pt layer) were formed by the sputtering method. In order to form the TiW film, a Ti—W target of which Ti content was 10 wt % was used for the target, and Ar (argon) was used for the sputtering gas, and the sputtering conditions were: RF power 800 W, Ar flow rate 50 sccm, and sputtering gas pressure $2.2 \times 10^{-1}$ Pa. The thickness of the TiW layer, which was the bottom layer, and the thickness of the Au layer layered directly thereon were 108 nm, and the thickness values of all the other Pt layers and the Au layers were 89 nm.

After forming the metal multi-layer film, the wafer was separated, by scribing and breaking, into LED element chips. The metal multi-layer film was separated together with the GaN substrate in this step. This means that the plane shape of the first n-side metal pad was the same as the shape of the rear face of the m-plane GaN substrate. The size of the first n-side metal pad was approximately the same as the chip size, that is 350 μm×340 μm.

2-5 Evaluation of Forward Voltage

For the LED chips obtained according to the above mentioned procedure, the forward voltage ($Vf_1$) when current was applied via the first n-side metal pad and p-side metal pad, and the forward voltage ($Vf_2$) when current was applied via the second n-side metal pad and the p-side metal pad, were compared. The applied current was a pulsed current, of which pulse width was 1 msec and pulse period was 100 msec, and there were two types of current value: 20 mA and 60 mA. The results of the comparison are shown in Table 3.

TABLE 3

| Rear face processing of m-plane | $Vf_1$ (V) | | $Vf_2$ (V) | | $Vf_1 - Vf_2$ (V) | |
|---|---|---|---|---|---|---|
| GaN substrate | 20 mA | 60 mA | 20 mA | 60 mA | 20 mA | 60 mA |
| Processing a | 3.7 | 4.3 | 3.7 | 4.3 | 0.0 | 0.0 |
| Processing b | 7.3 | 9.2 | 3.7 | 4.3 | 3.6 | 4.9 |
| Processing c | 7.3 | 9.1 | 3.7 | 4.3 | 3.5 | 4.8 |
| Processing d | 6.6 | 8.3 | 3.8 | 4.4 | 2.8 | 3.9 |
| Processing e | 8.2 | 9.5 | 3.7 | 4.3 | 4.5 | 5.2 |
| Processing f | 4.3 | 5.6 | 3.7 | 4.3 | 0.6 | 1.4 |

As Table 3 shows, $Vf_1$ and $Vf_2$ coincide in the case of the LED chip where only processing a was performed on the rear face of the m-plane GaN substrate, but $Vf_1$ was greater than $Vf_2$ in the case of the LED chips where one of the processings b to f was performed. In particular, in the case of the LED chips where one of the processings b to e, that includes RIE processing, was performed, the difference was a several V or more.

Table 4 shows $Vf_1$ when the forward current (20 mA, 60 mA, 100 mA, 120 mA, 180 mA, 240 mA and 350 mA), of which pulse width was 1 msec and pulse period was 100 msec, was applied to the LED chip where only the processing a was performed on the rear face of the m-plane GaN substrate. Table 4 also shows the mean current density in the first n-side metal pad in each case. The mean current density was a value generated by dividing the forward current by the area of the n-side metal pad (350 μm×340 μm), and indicates an average density of current that flows across the interface between the n-side metal pad and the m-plane GaN substrate.

TABLE 4

| | Forward current (mA) | | | | | | | |
|---|---|---|---|---|---|---|---|---|
| | 20 | 60 | 100 | 120 | 180 | 200 | 240 | 350 |
| Current density on first n-side metal pad (A/cm$^2$) | 17 | 50 | 84 | 101 | 151 | 168 | 202 | 294 |
| $Vf_1$ (V) | 3.7 | 4.3 | 4.7 | 4.9 | 5.3 | 5.4 | 5.6 | 6.0 |

From the above results, it would appear that the following semiconductor light emitting elements (I) to (XI) can be realized.

(I) A semiconductor light emitting element comprising an n-type conductive m-plane GaN substrate; a light emitting structure which is formed of a GaN-based semiconductor, on a front face of the m-plane GaN substrate; and an n-side ohmic electrode formed on a rear face of the m-plane GaN substrate, wherein a forward voltage is 4.0 V or less when a forward current applied to the element is 20 mA.

(II) A semiconductor light emitting element comprising: an n-type conductive m-plane GaN substrate; a light emitting structure which is formed of a GaN-based semiconductor, on a front face of the m-plane GaN substrate; and an n-side ohmic electrode formed on a rear face of the m-plane GaN substrate, wherein a forward voltage is 4.5 V or less when a forward current applied to the element is 60 mA.

(III) A semiconductor light emitting element comprising: an n-type conductive m-plane GaN substrate; a light emitting structure which is formed of a GaN-based semiconductor, on a front face of the m-plane GaN substrate; and an n-side ohmic electrode formed on a rear face of the m-plane GaN substrate, wherein a forward voltage is 5.0 V or less when a forward current applied to the element is 120 mA.

(IV) A semiconductor light emitting element comprising: an n-type conductive m-plane GaN substrate; a light emitting structure which is formed of a GaN-based semiconductor, on a front face of the m-plane GaN substrate; and an n-side ohmic electrode formed on a rear face of the m-plane GaN substrate, wherein a forward voltage is 5.5 V or less when a forward current applied to the element is 200 mA.

(V) A semiconductor light emitting element comprising: an n-type conductive m-plane GaN substrate; a light emitting structure which is formed of a GaN-based semiconductor, on a front face of the m-plane GaN substrate; and an n-side ohmic electrode formed on a rear face of the m-plane GaN substrate, wherein a forward voltage is 6.0 V or less when a forward current applied to the element is 350 mA.

(VI) The semiconductor light emitting element according to any one of (I) to (V), wherein the light emitting structure comprises an active layer formed of a GaN-based semiconductor, an n-type GaN-based semiconductor layer disposed between the active layer and the m-plane GaN substrate, and a p-type GaN-based semiconductor layer which sandwiches the active layer with the n-type GaN-based semiconductor layer.

(VII) The semiconductor light emitting element according to any one of (I) to (VI), wherein the semiconductor light emitting element is a light emitting diode element.

(VIII) The semiconductor light emitting element according to any one of (I) to (VII), wherein an area of the rear face of the m-plane GaN substrate is 0.0012 $cm^2$ or more.

(IX) The semiconductor light emitting element according to (VII), wherein an area of the n-side ohmic electrode is 0.0012 $cm^2$ or more, and equal to or less than the area of the rear face of the m-plane GaN substrate.

(X) The semiconductor light emitting element according to any one of (I) to (IX), wherein a carrier concentration of the m-plane GaN substrate is $1\times10^{17}$ $cm^{-3}$.

(XI) The semiconductor light emitting element according to any one of (I) to (X), wherein an arithmetic mean roughness Ra in a range of 10 μm squares at least in a portion contacting the n-side ohmic electrode of the rear face of the m-plane GaN substrate is 0.1 nm or less.

The present invention was completed based on the above mentioned experimental producing and evaluation of the LED elements. Needless to say, the present invention is not limited to the LED elements experimentally produced and the methods used for the experimental producing.

Now the GaN-based light emitting diode element and a method for manufacturing the GaN-based light emitting diode element according to an embodiment of the present invention will be described.

Embodiment 1

Figure 5A:
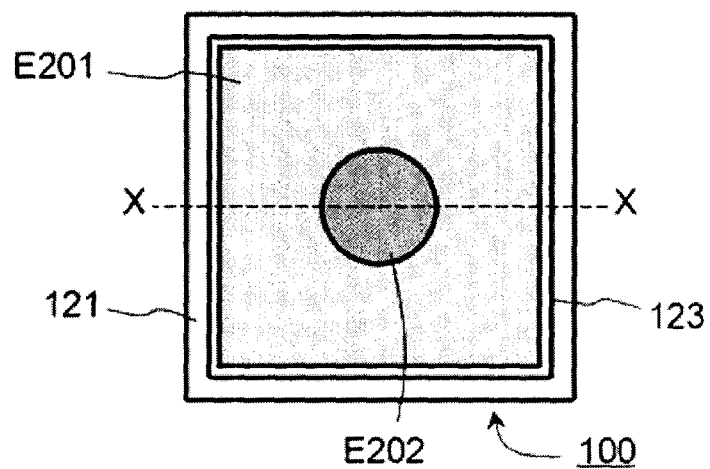
FIG. 5A is a plan view viewed from the epi-layer side.
Figure 5B:
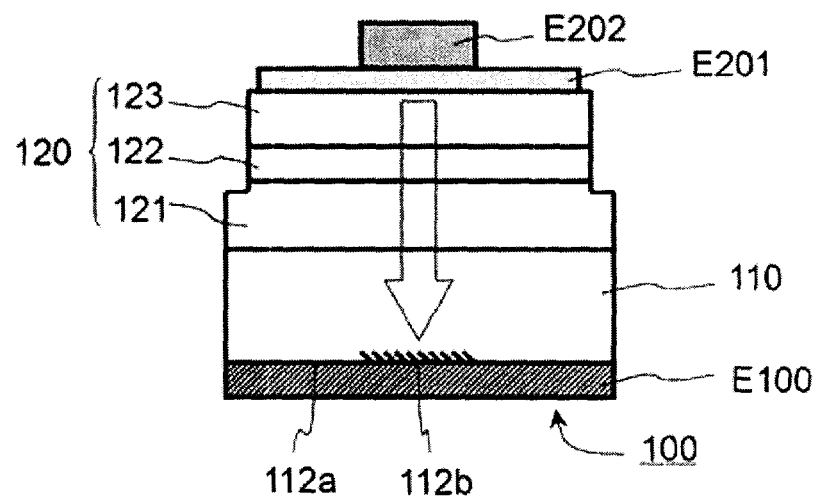
FIG. 5B is a cross-sectional view sectioned at the position of the X-X line in FIG. 5A.

A structure of a GaN-based light emitting diode element according to Embodiment 1 is schematically shown in FIG. 5. The GaN-based light emitting diode element 100 has a substrate 110 and an epi-layer 120 formed of a GaN-based semiconductor that is epitaxially grown thereon. FIG. 5A is a plan view when the GaN-based light emitting diode element 100 is viewed from the epi-layer 120 side, and FIG. 5B is a cross-sectional view sectioned at the position of the X-X line in FIG. 5A.

The substrate 110 is an n-type conductive m-plane GaN substrate. The epi-layer 120 includes an n-type layer 121 and a p-type layer 123 that constitute a pn-junction. An active layer 122 is formed between the n-type layer 121 and the p-type layer 123 so as to form a double hetero structure. An n-side electrode E100, which functions as both an ohmic electrode and an electrode pad, is formed on the rear face of the substrate 110, and a p-side ohmic electrode E201, which is a translucent electrode, is formed on the epi-layer 120. Light emission is generated in the active layer 122 by applying forward voltage on the epi-layer 120 via the n-side electrode E100 and the p-side electrode pad E202 formed on a part of the p-side ohmic electrode E201. This light transmits through the p-side ohmic electrode E201 and is emitted to the outside of the GaN-based light emitting diode element. A part of this light is also emitted from the end face of the substrate 110 and the end face of the epi-layer 120.

It is preferable that the n-type electrode E100 has a layered structure. In this case, the portion to contact the substrate 100 is formed of a material that makes ohmic contact with the n-type GaN-based semiconductor, such as Al, Ti, Cr, V, W or ITO, and the other portion is formed of a metal having high conductivity such as Au, Al, Cu or Ag.

The p-side ohmic electrode E201 is formed of a transparent conductive oxide (TCO) such as ITO. It is preferable that the p-side ohmic electrode E201 is formed so as to cover the entire top face of the p-type layer 123. The p-side electrode pad E202 is formed of a metal, and preferably has a layered structure. If the p-side electrode pad E202 has a layered structure, a portion to contact the p-side ohmic electrode E201 is formed of a metal that adheres with TCO well, such as Cr, Ti, Ni, Pt or Rh, and the other portion is formed of a metal having high conductivity such as Au, Al, Cu or Ag. The thickness of the p-side ohmic electrode E201 formed of TCO is preferably 0.1 μm to 0.5 μm, and the thickness of the p-side electrode pad E202 formed of metal is preferably 0.5 μm to 5 μm.

The n-side electrode E100 covers the entire rear face of the substrate 110. A low contact resistance area 112a, of which contact resistance with the n-side electrode E100 is relatively low, and a high contact resistance area 112b, of which this contact resistant is relatively high, exist on the rear face of the substrate 100. The low contact resistance area 112a is finished by polishing. In other words, the final processing (cleaning is not included) performed on the low contact resistance area 112a before forming the n-side electrode E100 is polishing processing. The high contact resistance area 112b, on the other hand, is finished by dry etching. In other words, the final processing performed on the high contact resistance area 112b before forming the n-side electrode E100 is dry etching processing such as reactive ion etching (RIE).

As the above mentioned experimental producing of LED elements and the evaluation result show, an electrode having low contact resistance can be formed on a surface (m-plane) obtained by polishing the n-type conductive m-plane GaN substrate using an acidic CMP slurry at low polishing rate of a 0.5 μm/h or less. An electrode formed on the surface of the m-plane GaN substrate, which is dry etched after polishing, has high contact resistance.

It is sufficient if the high contact resistance area 112b includes at least a part of the orthogonal projection of the p-side electrode pad E202 to the rear face of the substrate 101, but it is preferable that the high contact resistance area 112b includes all of the orthogonal projection. By this configuration, a concentration of the current, flowing through the substrate 110 and the epi-layer 120, on the shortest path that connects the p-side electrode E202 and the n-side electrode E100 (path indicated by the arrow in FIG. 5B) can be prevented. As a result, the light generated in the active layer 122 is less blocked or absorbed by the p-side electrode pad E202, compared with the case of the current being concentrated on this area. Furthermore the density of the current that flows across the active layer 122 becomes more uniform, hence a drop in emission efficiency due to the droop phenomena (phenomena unique to a GaN-based light emitting diode element where emission efficiency drops as the current density increases) can be suppressed.

Embodiment 2

Figure 6A:
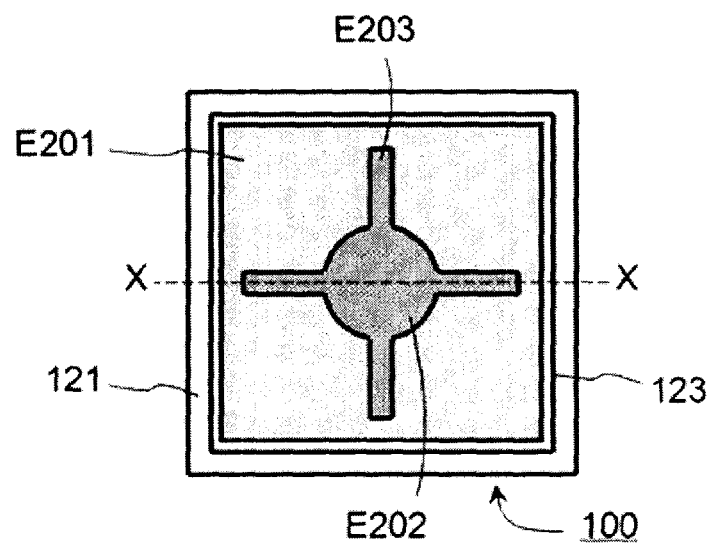
FIG. 6A is a plan view viewed from the epi-layer side.
Figure 6B:
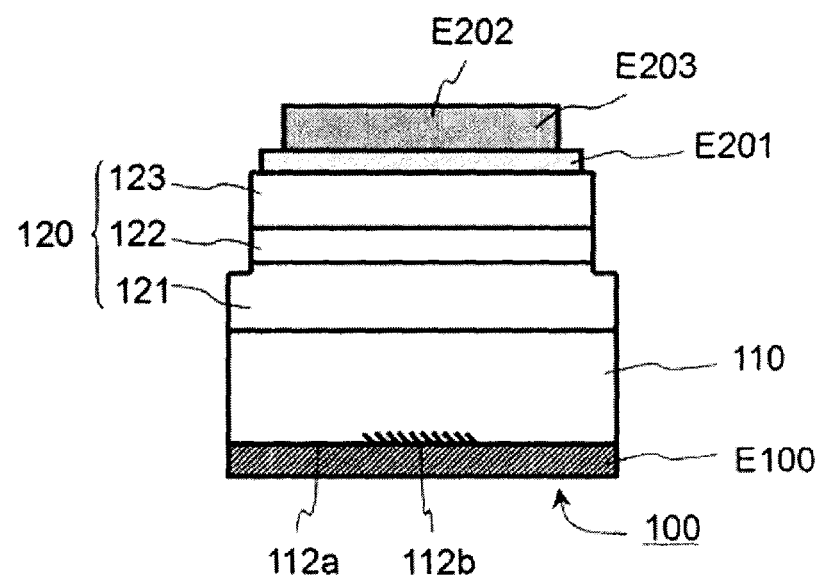
FIG. 6B is a cross-sectional view sectioned at the position of the X-X line in FIG. 6A.

A structure of a GaN-based light emitting diode element according to Embodiment 2 is schematically shown in FIG. 6. In FIG. 6, a composing element the same as that of the GaN-based light emitting diode element of Embodiment 1 is denoted with a same reference symbol. FIG. 6A is a plan view when the GaN-based light emitting diode element 100 is viewed from the epi-layer 120 side, and FIG. 6B is a cross-sectional view sectioned at the position of the X-X line in FIG. 6A.

In the GaN-based light emitting diode element 100 shown in FIG. 6, four auxiliary electrodes E203 are connected to the p-side electrode pad E202. This means that the current supplied to the p-side electrode pads E202 from a metal wire or the like is first extended in the lateral directions (directions perpendicular to the thickness direction of the epi-layer 120) by the linear shaped auxiliary electrodes E203, and then flows into the p-side ohmic electrode E201.

Out of the rear face of the substrate 110, a high contact resistance area 112b is formed on an area covered by the n-side electrode E100, so as to include at least a part, preferably all, of the orthogonal projection of the p-side electrode pad E202. Therefore the concentration of the current flowing through the substrate 110 and the epi-layer 120 on the shortest path that connects the p-side electrode pad E202 and the n-side electrode E100 can be prevented. Furthermore, the auxiliary electrodes E203 are connected to the p-side electrode pad E202, hence the current that flows through the epi-layer 120 is extended to areas sufficiently distant from the p-side electrode pad E202 in the lateral directions.

In the case of the GaN-based light emitting diode element 100 in FIG. 6, the orthogonal projection of the auxiliary electrodes E203 to the rear face of the substrate 110 is not included in the high contact resistance area 112b. Therefore although current flows in the direction directly downward from the auxiliary electrodes E203, influence on the light emission (blocking and absorption) in the areas immediately under the auxiliary electrodes E203 is relatively small, since the auxiliary electrodes E203 are formed to be long and narrow, unlike the p-side electrode pad E202. According to an embodiment, the high contact resistance area 112b may be formed so as to include all or a part of the orthogonal projection of the auxiliary electrodes E203 to the rear face of the substrate 110.

Embodiment 3

Figure 7A:
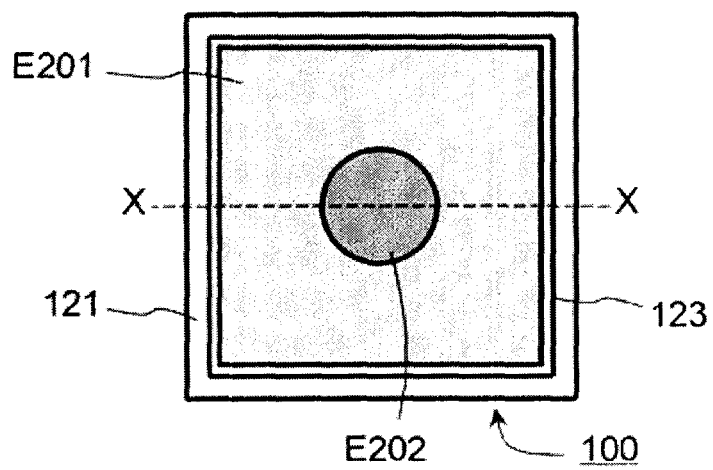
FIG. 7A is a plan view viewed from the epi-layer side.
Figure 7B:
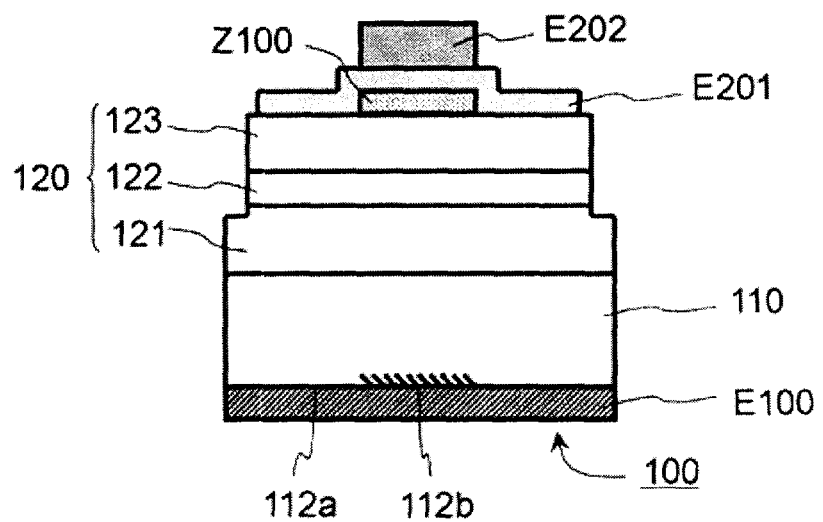
FIG. 7B is a cross-sectional view sectioned at the position of the X-X line in FIG. 7A.

A structure of a GaN-based light emitting diode element according to Embodiment 3 is schematically shown in FIG. 7. In FIG. 7, a composing element the same as that of the GaN-based light emitting diode element of Embodiment 1 is denoted with a same reference symbol. FIG. 7A is a plan view when the GaN-based light emitting diode element 100 is viewed from the epi-layer 120 side, and FIG. 7B is a cross-sectional view sectioned at the position of the X-X line in FIG. 7A.

In the GaN-based light emitting diode element 100 shown in FIG. 7, an insulating film Z100 is formed in a position directly under the p-side pad electrode E100, between the epi-layer 120 and the p-side ohmic electrode E201. Because of the two current blocking structures, that is the high contact resistance area 112b and the insulating film Z100 formed on the rear face of the substrate 110, the concentration of the current flowing through the substrate 110 and the epi-layer 120 on the shortest path that connects the p-side electrode pad E202 and the n-side electrode E100 can be effectively prevented.

Embodiment 4

Figure 8A:
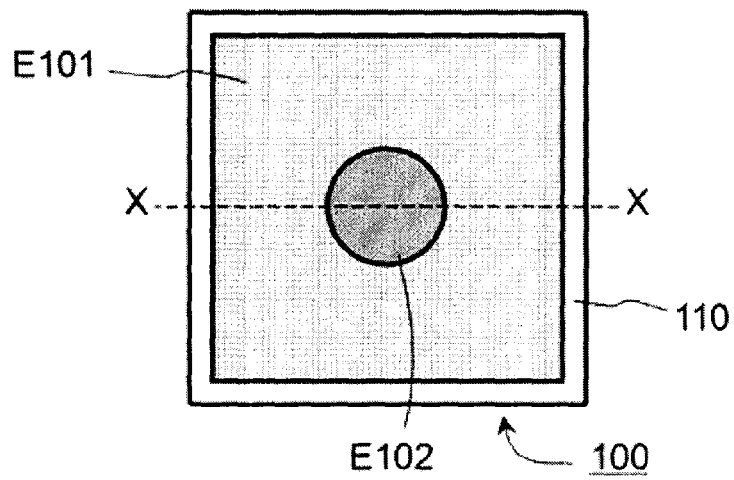
FIG. 8A is a plan view viewed from the substrate side.
Figure 8B:
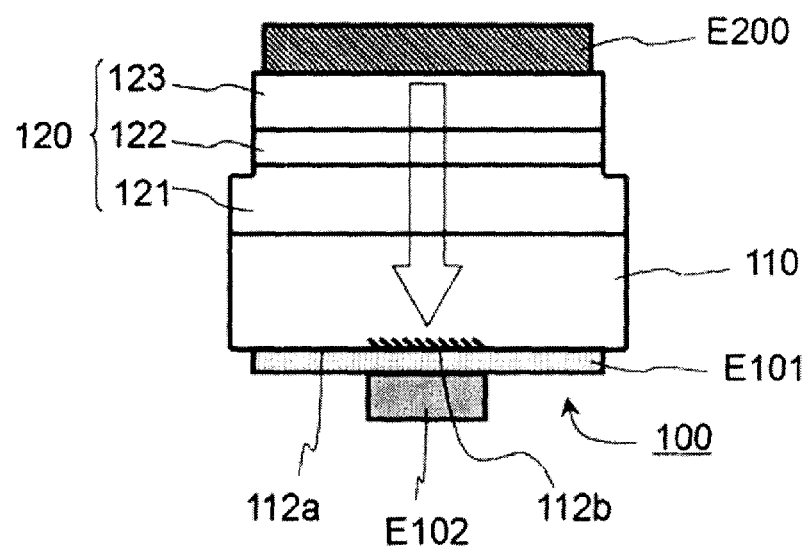
FIG. 8B is a cross-sectional view sectioned at the position of the X-X line in FIG. 8A.

A structure of a GaN-based light emitting diode element according to Embodiment 4 is schematically shown in FIG. 8. In FIG. 8, a composing element the same as that of the GaN-based light emitting diode element of Embodiment 1 is denoted with a same reference symbol. FIG. 8A is a plan view when the GaN-based light emitting diode element 100 is viewed from the substrate 110 side, and FIG. 8B is a cross-sectional view sectioned at the position of the X-X line in FIG. 8A.

In the GaN-based light emitting diode element 100 shown in FIG. 8, an n-side ohmic electrode E101 which is a translucent electrode is formed on the rear face of the substrate 110, and a p-side electrode E200 which functions as both an ohmic electrode and an electrode pad is formed on the epi-layer 120. Light emission is generated in the active layer 122 by applying forward voltage on the epi-layer 120 via the n-side electrode pad E102 formed on a part of the n-side ohmic electrode E101 and the p-side electrode E200. This light transmits through the n-side ohmic electrode E101, and is emitted to the outside of the GaN-based light emitting diode element. A part of this light is also emitted from the end face of the substrate 110 and the end face of the epi-layer 120.

The n-side ohmic electrode E101 is formed of a transparent conductive oxide (TCO) such as ITO. The n-side electrode pad E102 is formed of a metal and preferably has a layered structure. If the n-side electrode pad E102 has a layered structure, a portion to contact the n-side ohmic electrode E201 is formed of a metal that adheres to TCO well, such as Cr, Ti, Ni, Pt or Rh, and the other portion is formed of a metal having high conductivity such as Au, Al, Cu or Ag. The thickness of the n-side ohmic electrode E101 formed of TCO is preferably 0.1 μm to 0.5 μm, and the thickness of the n-side electrode pad E102 formed of metal is preferably 0.5 μm to 5 μm.

It is preferable that the p-side electrode E200 has a layered structure. In this case, the portion to contact the p-type layer 123 is formed of a material that generates ohmic contact with the p-type GaN-based semiconductor, such as Ni, Au, Pt, Pd, Co or ITO, and the other portion is formed of a metal having high conductivity such as Au, Al, Cu or Ag. It is preferable that the p-side electrode E200 is formed so as to cover the entire top face of the p-type layer 123.

The n-side ohmic electrode E101 covers the entire rear face of the substrate 110. A low contact resistance area 112a, of which contact resistance with the n-side ohmic electrode E101 is relatively low, and a high contact resistance area 112b, of which this contact resistance is relatively high, exist on the rear face of the substrate 110. The low contact resistance area 112a is an area finished by polishing, and the high contact resistance area 112b is an area finished by dry etching.

The high contact resistance area 112b is formed immediately under the n-side electrode pad E102. It is sufficient if the high contact resistance area 112b includes at least a part of the orthogonal projection of the n-side electrode pad E102 to the rear face of the substrate 110, but it is preferable that the high contact resistance area 112b includes all of the orthogonal projection. By this configuration, the concentration of the current flowing through the substrate 110 and the epi-layer 120 on the shortest path that connects the p-side electrode E200 and the n-side electrode pad E102 (path indicated by the arrow in FIG. 8B) can be prevented. As a result, the light generated in the active layer 122 is less blocked or absorbed by the n-side electrode pad E102, compared with the case of the current that is concentrating in this area. Furthermore, the density of the current that flows crossing the active layer 122 becomes more uniform, hence the drop in emission efficiency due to the droop phenomena (phenomena unique to a GaN-based light emitting diode element where emission efficiency drops as the current density increases) can be suppressed.

Embodiment 5

Figure 9A:
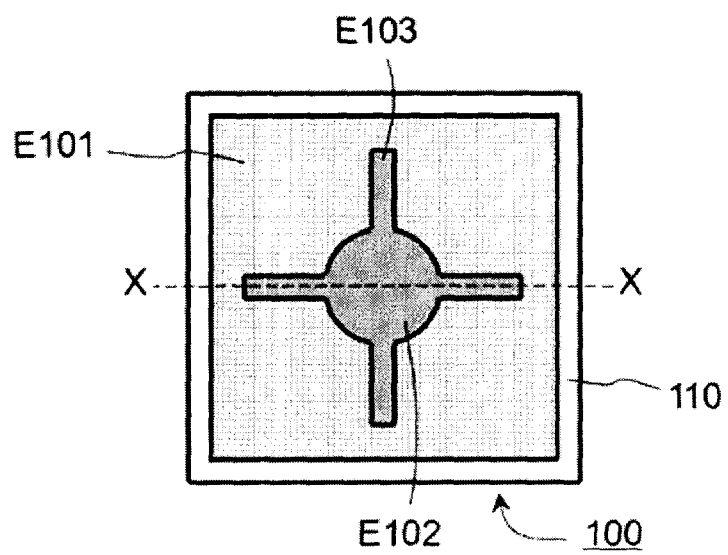
FIG. 9A is a plan view viewed from the substrate side.
Figure 9B:
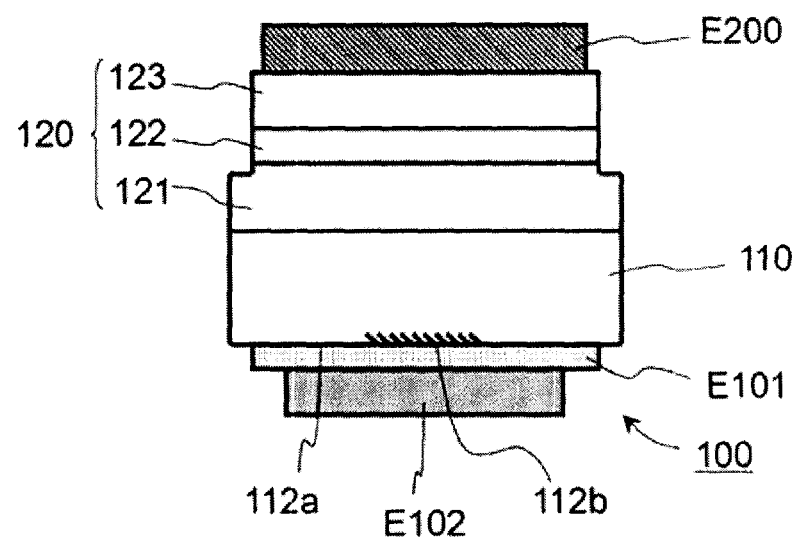
FIG. 9B is a cross-sectional view sectioned at the position of the X-X line in FIG. 9A.

A structure of a GaN-based light emitting diode element according to Embodiment 5 is schematically shown in FIG. 9. In FIG. 9, a composing element the same as that of the GaN-based light emitting diode element of Embodiment 1 is denoted with a same reference symbol. FIG. 9A is a plan view when the GaN-based light emitting diode element 100 is viewed from the substrate 110 side, and FIG. 9B is a cross-sectional view sectioned at the position of the X-X line in FIG. 9A.

In the GaN-based light emitting diode element 100 shown in FIG. 9, four auxiliary electrodes E103 are connected to the n-side electrode pad E102. This means that the current supplied to the n-side electrode pad E102 from a metal wire or the like is first extended in the lateral directions (directions perpendicular to the thickness direction of the substrate layer 110) by the linear shaped auxiliary electrodes E103, and then flows into the n-side ohmic electrodes E101.

Out of the rear face of the substrate 110, a high contact resistance area 112b is formed on an area covered by the n-side ohmic electrode E101, so as to include at least a part, preferably all, of the orthogonal projection of the n-side electrode pad E102. Therefore the concentration of the current flowing through the substrate 110 and the epi-layer 120 on the shortest path that connects the p-side electrode E200 and the n-side electrode pad E102 can be prevented. Furthermore, the auxiliary electrodes E103 are connected to the n-side electrode pad E102, hence the current that flows through the epi-layer 120 is extended to areas sufficiently distant from the n-side electrode pad E102 in the lateral directions.

In the case of the GaN-based light emitting diode element 100 in FIG. 9, the orthogonal projection of the auxiliary electrodes E103 to the rear face of the substrate 110 is not included in the high contact resistance area 112b. Therefore although current flows in the direction directly downward from the auxiliary electrodes E103, influence on the light emission (blocking and absorption) in the area immediately under the auxiliary electrodes E103 is relatively small since the auxiliary electrodes E103 are formed long and narrow, unlike the n-side electrode pad E202. According to an embodiment, the high contact resistance area 112b may be formed so as to include all or a part of the orthogonal projection of the auxiliary electrodes E103 onto the rear face of the substrate 110.

Embodiment 6

Figure 10A:
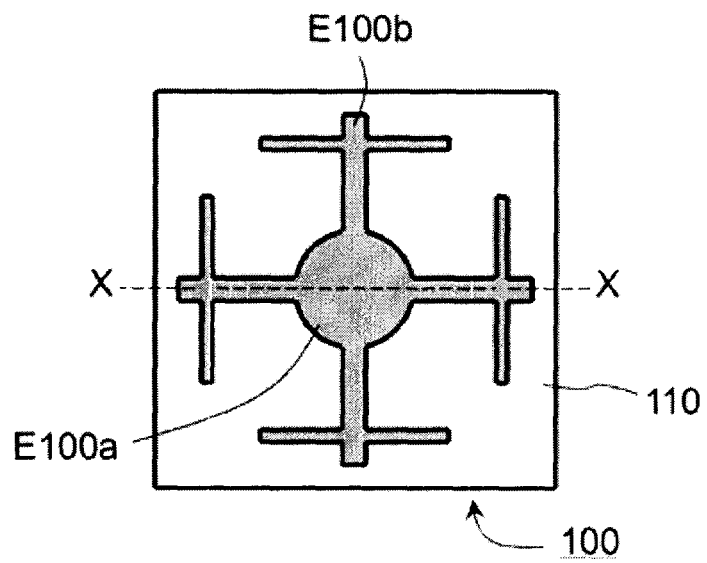
FIG. 10A is a plan view viewed from the substrate side.
Figure 10B:
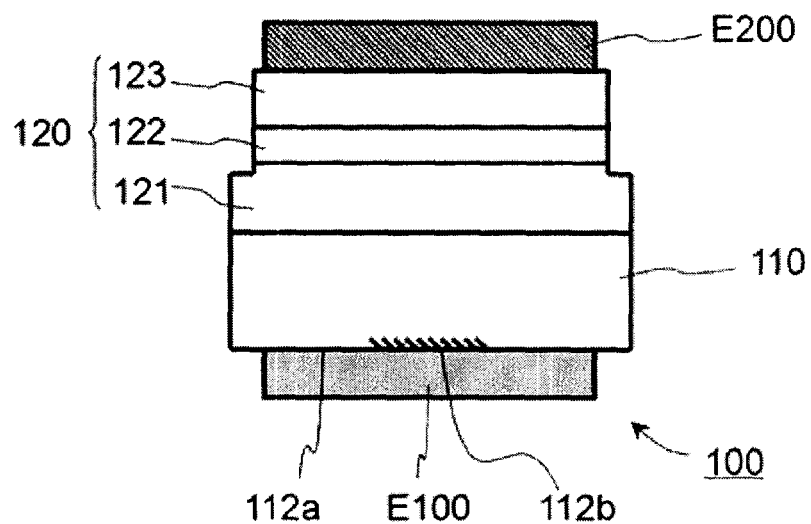
FIG. 10B is a cross-sectional view sectioned at the position of the X-X line in FIG. 10A.

A structure of a GaN-based light emitting diode element according to Embodiment 6 is schematically shown in FIG. 10. In FIG. 10, a composing element the same as that of the GaN-based light emitting diode element of Embodiment 1 is denoted with a same reference symbol. FIG. 10A is a plan view when the GaN-based light emitting diode element 100 is viewed from the substrate 110 side, and FIG. 10B is a cross-sectional view sectioned at the position of the X-X line in FIG. 10A.

In the GaN-based light emitting diode element 100 shown in FIG. 10, the n-side electrode E100 including a pad portion is directly formed on the rear face of the substrate 110. The n-side electrode E100 has a pad portion E100a which also functions as an electrode pad and auxiliary portions 100b is connected to the pad portion E100a and has a cross pattern (branched linear pattern).

It is preferable that in the n-side electrode E100, a portion to contact the substrate 110 is formed of a material that generates ohmic contact with the n-type GaN-based semiconductor, such as Al, Ti, Cr, V, W or ITO, and the other portion is formed of a metal having high conductivity such as Au, Al, Cu or Ag.

Out of the rear face of the substrate 110, a high contact resistance area 112b is formed on an area covered by the n-side ohmic electrode E100, so as to include at least a part, preferably all, of the orthogonal projection of the n-side electrode pad portion E100a. Hence carriers (electrons) are injected from the n-side electrode E100 into the substrate 110, not directly via the pad portion E100a, but after being extended in the lateral directions by the auxiliary portions E100b. Therefore compared with the case of not disposing the high contact resistance area 112b, the density of current, that flows through the light emitting structure in the epi-layer 120, becomes more uniform. Although current flows in the direction directly downward from the auxiliary portions E100b, influence on the light emission (blocking and absorption) in the area immediately under the auxiliary portions E100b is relatively small, since the auxiliary portions E100b are formed long and narrow, unlike the pad portion E100a.

Embodiment 7

Figure 11A:
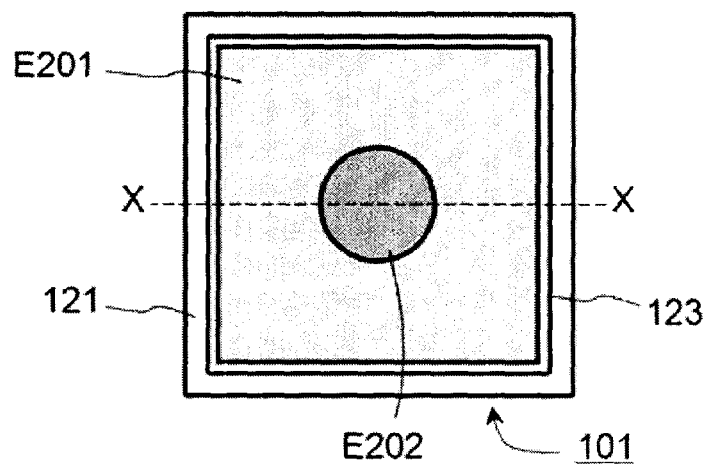
FIG. 11A is a plan view viewed from the epi-layer side.
Figure 11B:
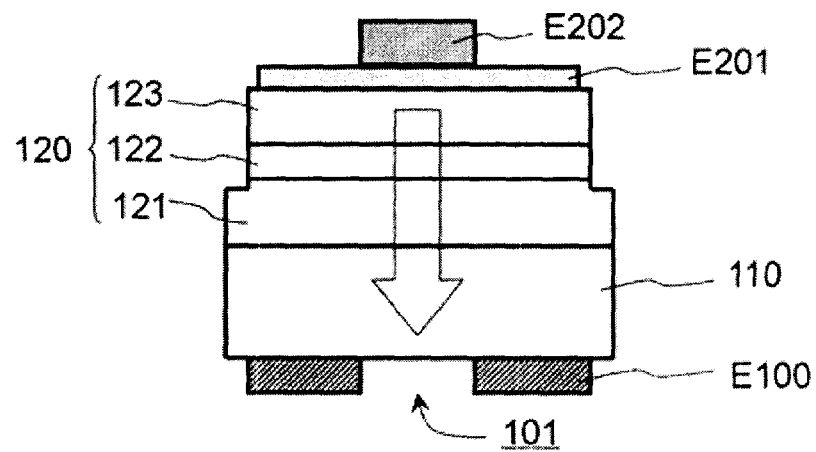
FIG. 11B is a cross-sectional view sectioned at the position of the X-X line in FIG. 11A.
Figure 12:
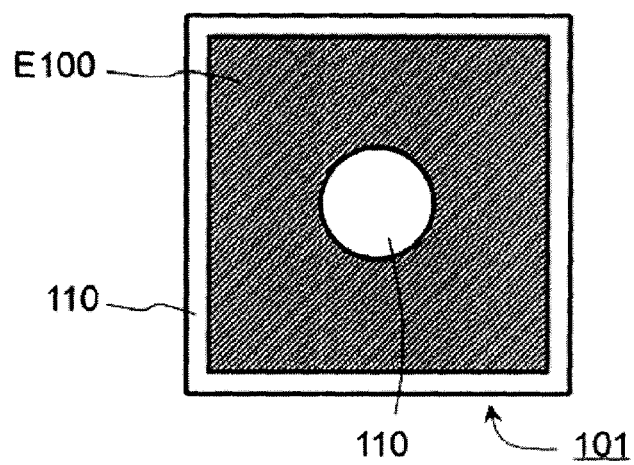
FIG. 12 is a plan view of the GaN-based light emitting diode element shown in FIG. 11 viewed from the substrate side.

A structure of a GaN-based light emitting diode element according to Embodiment 7 is schematically shown in FIG. 11. The GaN-based light emitting element 101 shown in FIG. 11 has a substrate 110 and an epi-layer 120 formed of a GaN-based semiconductor epitaxially grown on the substrate 110. FIG. 11A is a plan view when the GaN-based light emitting diode element 101 is viewed from the epi-layer 120 side, and FIG. 11B is a cross-sectional view sectioned at the position of the X-X line in FIG. 11A. FIG. 12 is a plan view when the GaN-based light emitting diode element 101 is viewed from the substrate 110 side.

The substrate 110 is an n-type conductive m-plane GaN substrate. The epi-layer 120 includes an n-type layer 121 and a p-type layer 123 that constitute a pn-junction. An active layer 122 is formed between the n-type layer 121 and the p-type layer 123 so as to form a double hetero structure. An n-side electrode E100 which functions as both an ohmic electrode and an electrode pad is formed on the rear face of the substrate 110. A p-side ohmic electrode E201 which is a translucent electrode is formed on the epi-layer 120. Light emission is generated in the active layer 122 by applying forward voltage on the epi-layer 120 via the n-side electrode E100 and the p-side electrode pad E202 formed on a part of the p-side ohmic electrode E201. This light is emitted to the outside of the GaN-based light emitting diode element 101 via the surface of the p-side ohmic electrode E201, the end face of the epi-layer 120, and the end face of the substrate 110.

In the n-side electrode E100, at least a portion to contact with the substrate 110 is formed of a material that generates ohmic contact with the n-type GaN-based semiconductor, such as Al, Ti, Cr, V, W or ITO. In the n-side electrode E100, according to a preferred embodiment, the portion to contact with the substrate 110 is formed of such a material as Al, Ti, Cr, V, W or ITO, and a layer formed of a metal having high conductivity such as Au, Al, Cu or Ag is layered thereon to create a multi-layer structure.

The p-side ohmic electrode E201 is formed of a transparent conductive oxide (TCO) such as ITO. It is preferable that the p-side ohmic electrode E201 is formed so as to cover the entire top face of the p-type layer 123. The p-side electrode pad E202 is formed of a metal. According to a preferred embodiment, in the p-side electrode pad E202, a portion to contact the p-side ohmic electrode E201 is formed of a metal that adheres with TCO well, such as Cr, Ti, Ni, Pt or Rh, and a layer formed of a metal having high conductivity such as Au, Al, Cu or Ag is layered thereon to create a multi-layer structure. The thickness of the p-side ohmic electrode E201 formed of TCO is preferably 0.1 µm to 0.5 µm, and the thickness of the p-side electrode pad E202 formed of the metal is preferably 0.5 µm to 5 µm.

As FIG. 12 shows, the n-side electrode E100, formed on the rear face of the substrate 100, is patterned to have a predetermined shape. A circular opening is created at the center of the n-side electrode E100, in a position overlapping with the orthogonal projection of the p-side electrode pad E202 to the rear face of the substrate 110. Because of this opening, the current flowing from the p-side electrode pad E202 to the epi-layer 120 does not concentrate on the area directly under the p-side electrode pad E202. In other words, the current does not concentrate on the path indicated by the arrow in FIG. 11B. As a result, the light generated in the active layer 122 is less blocked or absorbed by the p-side electrode pad E202, compared with the case of the current being concentrated on this path. Furthermore, the density of the current that flows crossing the active layer 122 becomes more uniform, hence the drop in emission efficiency due to the droop phenomena (phenomena unique to a GaN-based light emitting diode element where emission efficiency drops as the current density increases) can be suppressed.

Embodiment 8

Figure 13:
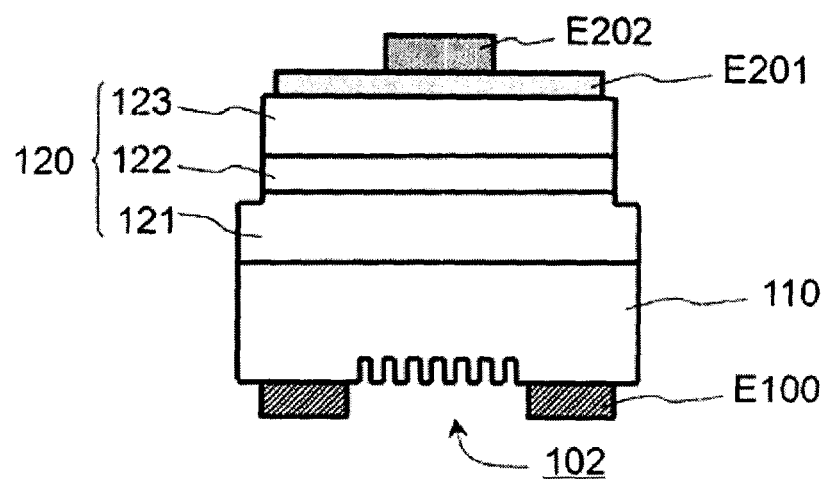
FIG. 13 is a schematic cross-sectional view depicting a structure of a GaN-based light emitting diode element according to an embodiment of the present invention (Embodiment 8)

A cross-sectional structure of a GaN-based light emitting diode element according to Embodiment 8 is schematically shown in FIG. 13. In FIG. 13, a composing element the same as that of the GaN-based light emitting diode element 101 in Embodiment 7 is denoted with a same reference symbol. In the GaN-based light emitting diode element 102 shown in FIG. 13, a concave-convex pattern that can diffusely reflect light generated in the active layer 122 is formed on the rear face of the substrate 110 in a portion that is not covered by the n-side electrode E100. This concave-convex pattern is a pattern where concave dot portions or convex dot portions are periodically arranged, for example, and can be formed by photolithography and dry etching. The concave-convex pattern can diffusely reflect light having near ultraviolet to visible wavelengths generated in the active layer 122, if the depth of the concave portions or the height of the convex portions and the period of the pattern is 1 µm or more. By forming the concave-convex pattern that can generate diffuse reflection, multiple reflection is suppressed and light extraction efficiency can be improved. A concave-convex surface not having periodicity but having a similar effect may be formed by dry etching using a random etching mask or sandblast, instead of forming the concave-convex pattern having periodicity.

Embodiments 9 and 10

Figure 14A:
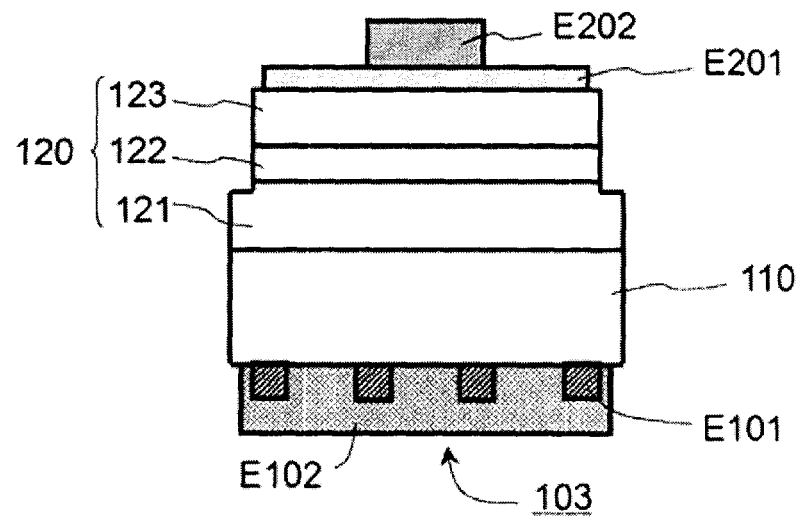
FIG. 14A is schematic cross-sectional views depicting a structure of a GaN-based light emitting diode element according to an embodiment of the present invention (Embodiments 9)
Figure 14B:
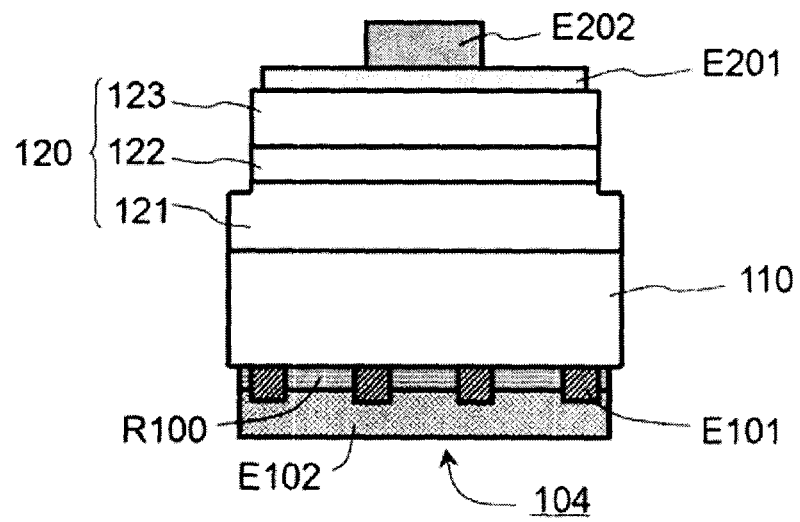
FIG. 14B is schematic cross-sectional views depicting a structure of a GaN-based light emitting diode element according to an embodiment of the present invention (Embodiments 10)
Figure 15A:
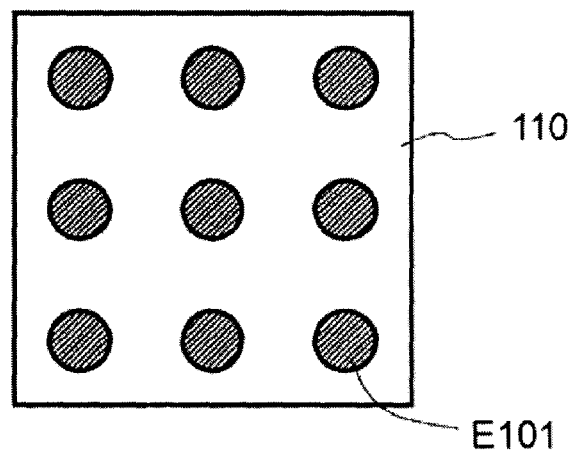
FIG. 15A is diagram depicting example of a pattern of an n-side ohmic electrode on the rear face of the substrate.
Figure 15B:
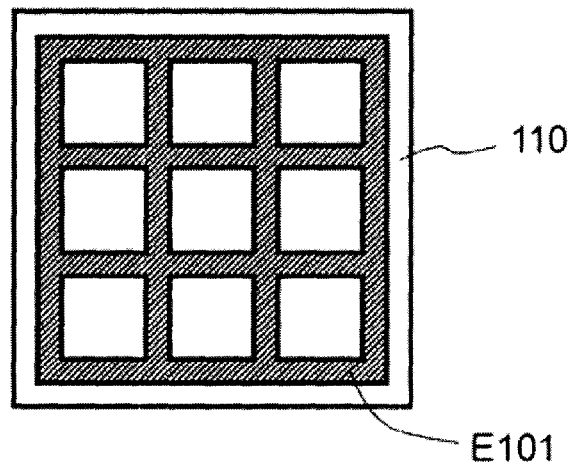
FIG. 15B is diagram depicting example of a pattern of an n-side ohmic electrode on the rear face of the substrate.

Cross-sectional structures of GaN-based light emitting diode elements according to Embodiments 9 and 10 are schematically shown in FIG. 14. In FIG. 14, a composing element the same as that of the GaN-based light emitting diode element 101 of Embodiment 7 is denoted with a same reference symbol. In the GaN-based light emitting diode element 103 shown in FIG. 14A and the GaN-based light emitting diode element 104 shown in FIG. 14B, a patterned n-side ohmic electrode E101 and an n-side electrode pad E102 that covers the n-side ohmic electrode E101 are formed on the rear face of the substrate 110, instead of the n-side electrode E100 which functions as both an ohmic electrode and an electrode pad. Examples of the pattern that the n-side ohmic electrode E101 has on the rear face of the substrate 110 can be a dot pattern shown in FIG. 15A, and a net pattern shown in FIG. 15B. The n-side ohmic electrode E101 is preferably patterned by the subtractive method.

In the GaN-based light emitting diode element 103 in FIG. 14A, the n-side electrode pad E102 contacts the exposed rear face of the substrate 110, but in the case of the GaN-based light emitting diode element 104 in FIG. 14B, a dielectric reflection film R100 exists between the rear face of the substrate 110 and the n-side electrode pad E102. A preferred example of the dielectric reflection film R100 is a Bragg reflection film (DBR), but the present embodiment is not limited to this, and a single layer film formed of dielectric material of which refractive index is lower than the substrate 110 may be used instead.

In the GaN-based light emitting diode elements 103 and 104, it is preferable that the n-side ohmic electrode E101 is formed to have a 0.05 µm to 0.5 µm thickness using a material that makes ohmic contact with the n-type GaN-based semiconductor, such as Al, Ti, Cr, V, W or ITO, by a vapor phase method such as evaporation, sputtering and CVD. The n-side electrode pad E102 preferably includes a 0.5 µm to 5 µm thick layer formed by a metal having high conductivity such as Au, Al, Cu or Ag. On the substrate side 110, the n-side electrode pad E102 preferably includes a high reflection portion formed of a metal that has high reflectance in the near ultraviolet to visible wavelengths region, such as Ag, Al, Rh or Pt.

Embodiment 11

Figure 16A:
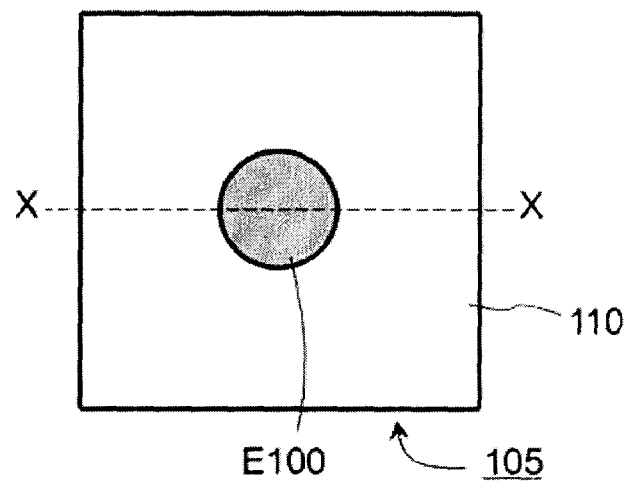
FIG. 16A is a plan view viewed from the substrate side.
Figure 16B:
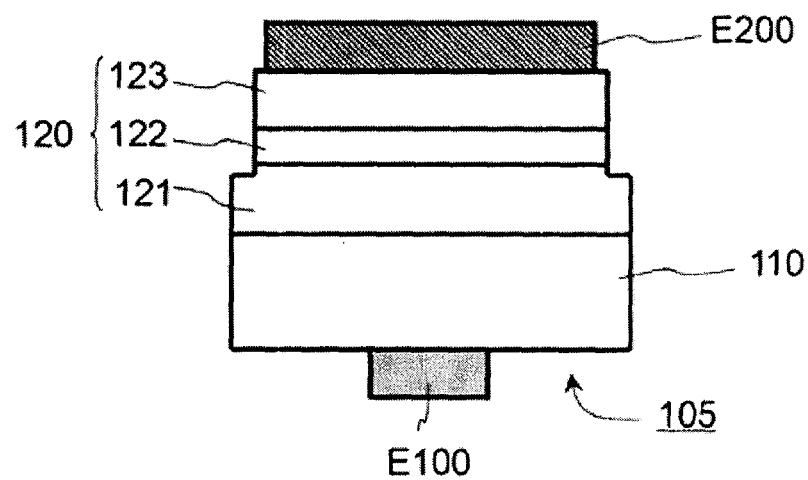
FIG. 16B is a cross-sectional view sectioned at the position of the X-X line in FIG. 16A.

A structure of a GaN-based light emitting diode element according to Embodiment 11 is schematically shown in FIG. 16. FIG. 16A is a plan view viewed from the substrate side, and FIG. 16B is a cross-sectional view sectioned at the position of the X-X line in FIG. 16A. In FIG. 16, a composing element the same as that of the GaN-based light emitting diode element 101 of Embodiment 7 is denoted with a same reference symbol. In the GaN-based light emitting diode element 105 shown in FIG. 16, an electrode formed on the p-type layer 123 is the p-side electrode E200, which functions as both the ohmic electrode and the electrode pad, and the area of the n-side electrode E100 is small, so that the light generated in the active layer 122 is emitted to the outside of the GaN-based light emitting diode element 100 through the rear face of the substrate 110. According to a preferred embodiment, in the p-side electrode E200, a portion to contact with the p-type layer 123 is formed of a material that makes ohmic contact with the p-type GaN-based semiconductor, and a layer formed of a metal having high conductivity such as Au, Al, Cu or Ag, is layered thereon to create a multi-layer structure. Examples of a material that generates ohmic contact with the p-type GaN-based semiconductor are such metals as Ni, Au, Pd, Rh, Pt and Co, and such transparent conductive oxides as ITO, zinc-added indium oxide, zinc oxide, tin oxide, titanium oxide and gallium oxide. The layer formed of a metal having high conductivity is preferably formed to have a 0.5 μm to 5 μm thickness.

Embodiment 12

Figure 17A:
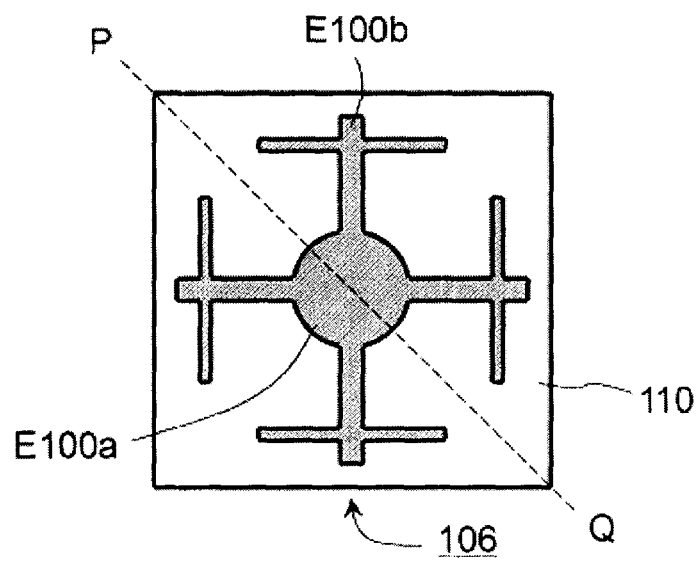
FIG. 17A is a plan view viewed from the substrate side.
Figure 17B:
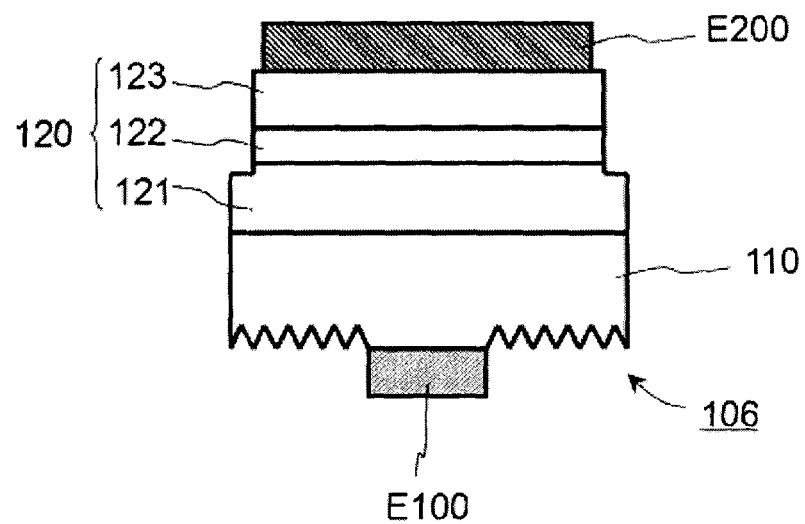
FIG. 17B is a cross-sectional view sectioned at the position of the P-Q line in FIG. 17A.

A structure of a GaN-based light emitting diode element according to Embodiment 12 is schematically shown in FIG. 17. In FIG. 17, a composing element the same as that of the GaN-based light emitting diode element 101 of Embodiment 7 is denoted with a same reference symbol. The GaN-based light emitting diode element 106 shown in FIG. 17 is a modification of the GaN-based light emitting diode element 105 shown in FIG. 16. As a difference, the n-side electrode E100, in the GaN-based light emitting diode element 106, comprises a connection portion E100a where a bonding wire or the like is connected, and extended portions E100b for extending the current in the lateral directions (directions perpendicular to the thickness direction of the substrate 110) as shown in the plan view in FIG. 17A. Furthermore, in the GaN-based light emitting diode element 106, the exposed portion of the rear face of the substrate 110 is processed to be rough, as shown in FIG. 17B which is a cross-sectional view sectioned at the position of the P-Q line in FIG. 17A. In this roughened portion, micron-sized convexoconcaves that can diffusely reflect the light generated in the active layer 122, a sub-micron-sized periodically concave-convex pattern that can diffract the light generated in the active layer 122, or sub-micron-sized convexoconcaves that can suppress total reflection of the light generated in the active layer 122 can be formed. The sub-micron-sized microscopic concavoconvexs can be formed by a method for etching the substrate 110 using polymer particles or silica particles for the mask.

Embodiment 13

Figure 18A:
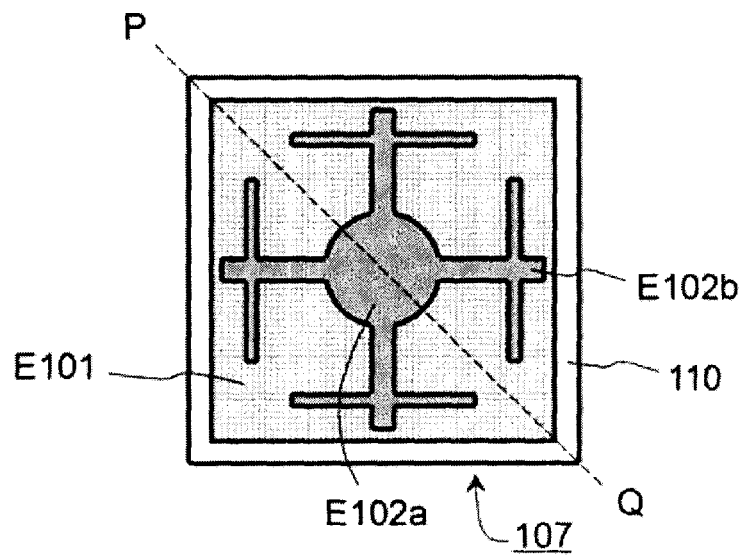
FIG. 18A is a plan view viewed from the substrate side.
Figure 18B:
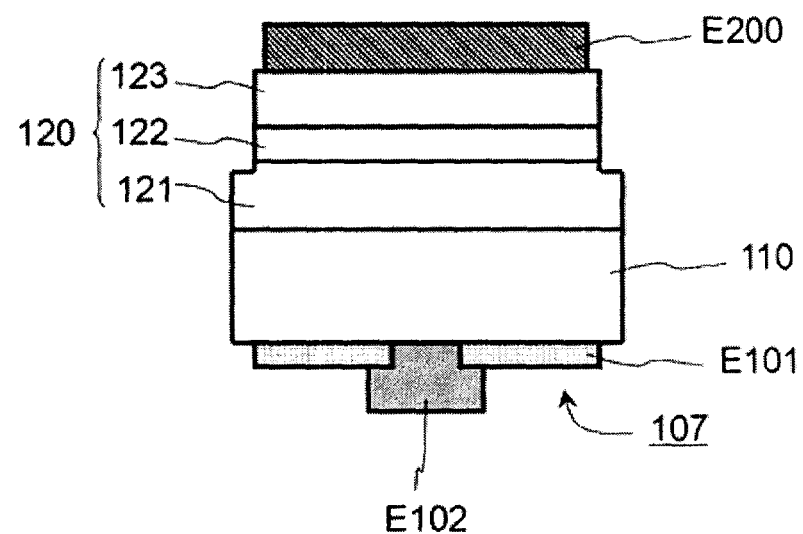
FIG. 18B is a cross-sectional view sectioned at the position of the P-Q line in FIG. 18A.

A structure of a GaN-based light emitting diode element according to Embodiment 13 is schematically shown in FIG. 18. FIG. 18A is a plan view viewed from the substrate side, and FIG. 18B is a cross-sectional view sectioned at the position of the P-Q line in FIG. 18A. In FIG. 18, a composing element the same as that of the GaN-based light emitting diode element 101 of Embodiment 7 is denoted with a same reference symbol. The GaN-based light emitting diode element 107 shown in FIG. 18 is another modification of the GaN-based light emitting diode element 105 shown in FIG. 16. As a difference, in the GaN-based light emitting diode element 107, a translucent n-side ohmic electrode E101 formed of such a transparent conductive oxide as ITO and an n-side electrode pad E102 disposed on a part of the n-side ohmic electrode E101 are formed on the rear face of the substrate 110 as shown in FIG. 18A and FIG. 18B, instead of the n-side electrode E100 which functions as both the ohmic electrode and the electrode pad.

As with the n-side electrode E100 of the GaN-based light emitting diode element 106 in FIG. 17, the n-side electrode pad E102 comprises a connection portion E102a where a bonding wire or the like is connected and extended portions E102b for extending the current in the lateral directions. The translucent n-side ohmic electrode E101 is patterned, and a circular opening exists directly under the n-side electrode pad E102a.

Embodiment 14

Figure 19A:
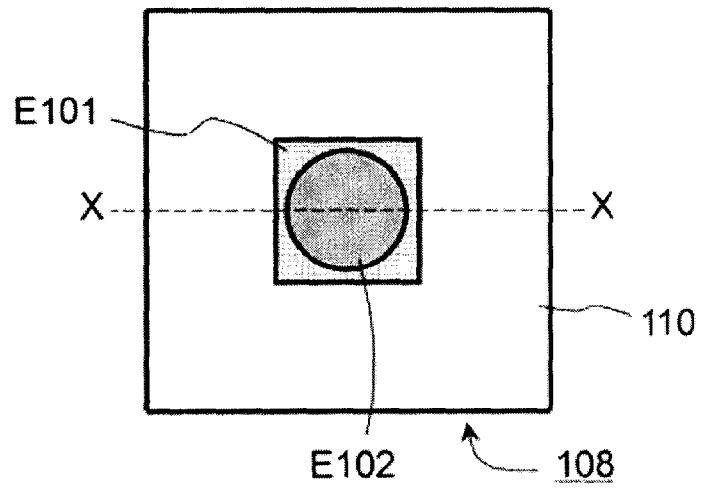
FIG. 19A is a plan view viewed from the substrate side.
Figure 19B:
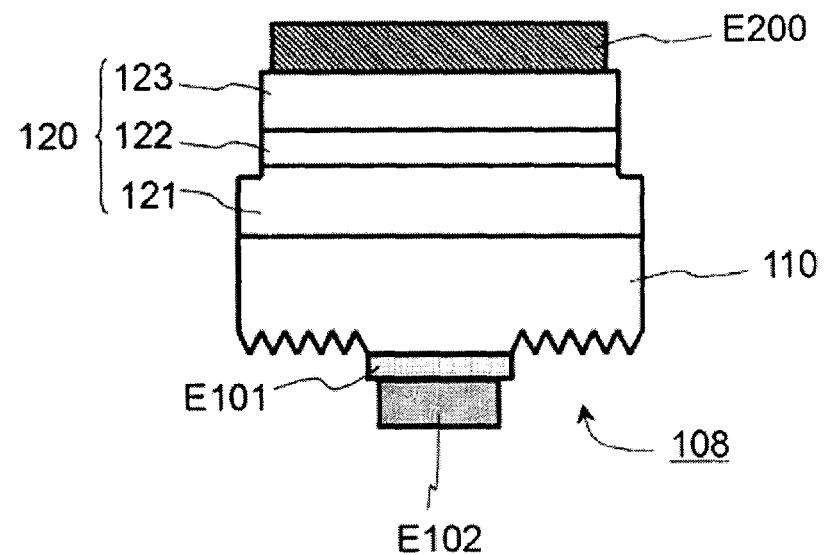
FIG. 19B is a cross-sectional view sectioned at the position of the X-X line in FIG. 19A.

A structure of a GaN-based light emitting diode element according to Embodiment 14 is schematically shown in FIG. 19. FIG. 19A is a plan view viewed from the substrate side, and FIG. 19B is a cross-sectional view sectioned at the position of the X-X line in FIG. 19A. In FIG. 19, a composing element the same as that of a GaN-based light emitting diode element 101 of Embodiment 7 is denoted with a same reference symbol. The GaN-based light emitting diode element 108 shown in FIG. 19 is still another modification of the GaN-based light emitting diode element 105 shown in FIG. 16. As a difference, in the light emitting diode 108, a translucent n-side ohmic electrode E101 formed of such a transparent conductive oxide as ITO and an n-side electrode pad E102 disposed on a part of the n-side ohmic electrode E101 are formed on the rear face of the substrate 110 as shown in FIG. 19A and FIG. 19B, instead of the n-side electrode E100 which functions as both the ohmic electrode and the electrode pad. However, unlike the GaN-based light emitting diode element 107 in FIG. 18, the n-side ohmic electrode E101 does not cover a wide area of the rear face of the substrate 110, and the area of the n-side ohmic electrode E101 is just slightly larger than the n-side electrode pad E102. Also in the GaN-based light emitting diode element 108, unlike the GaN-based light emitting diode element 105 in FIG. 16, the surface portion that is not covered by the n-side ohmic electrode E101, out of the rear face of the substrate 110, is roughened.

Embodiment 15

Figure 20A:
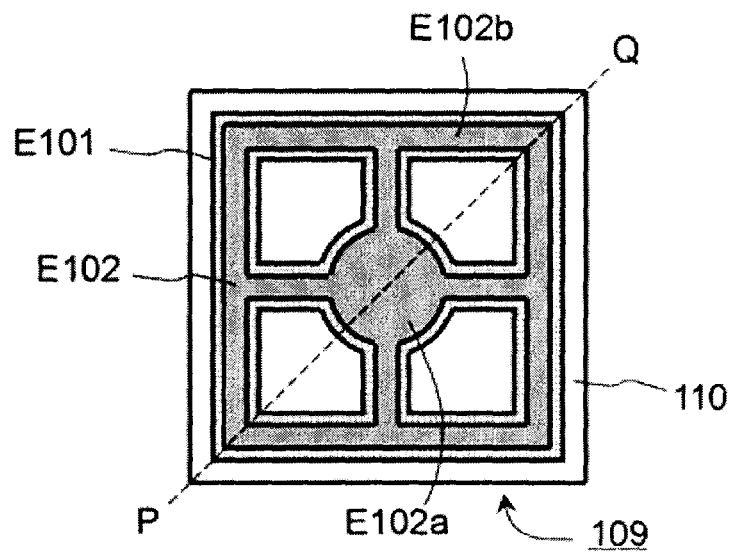
FIG. 20A is a plan view viewed from the substrate side.
Figure 20B:
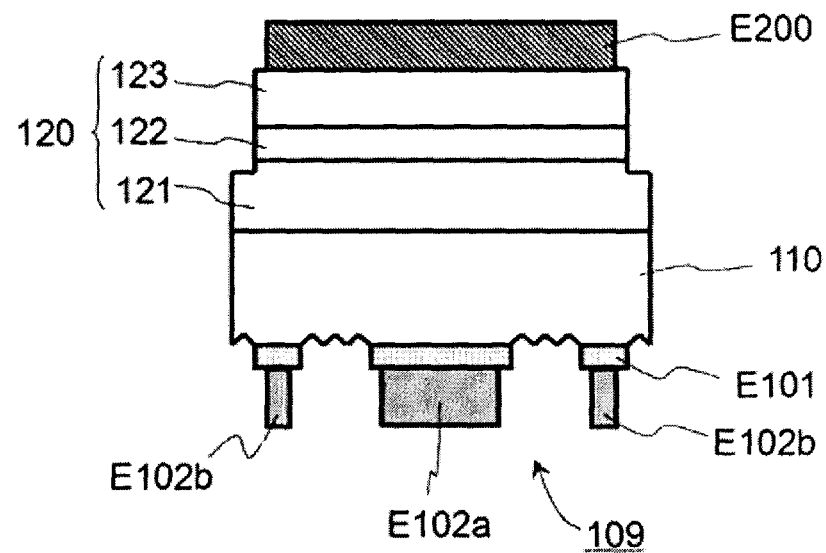
FIG. 20B is a cross-sectional view sectioned at the position of the P-Q line in FIG. 20A.

A structure of a GaN-based light emitting diode element according to Embodiment 15 is schematically shown in FIG. 20. FIG. 20A is a plan view viewed from the substrate side, and FIG. 20B is a cross-sectional view sectioned at the position of the P-Q line in FIG. 20A. In FIG. 20, a composing element the same as that of a GaN-based light emitting diode element 101 of Embodiment 7 is denoted with a same reference symbol. The GaN-based light emitting diode element 109 shown in FIG. 20 is a modification of the GaN-based light emitting diode element 108 shown in FIG. 19. As a difference, in the GaN-based light emitting diode element 109, the n-side electrode pad E102 comprises a connection portion E102a where a bonding wire or the like is connected, and a grid type extended portion E102b that extends the current in the lateral directions (directions perpendicular to the thickness direction of the substrate 110) as shown in FIG. 20A and FIG. 20B. The n-side ohmic electrode E101 disposed between the n-side electrode pad E102 and the p-type layer 123 has approximately the same shape as the n-side electrode pad E102, but has been patterned to be slightly wider.

(Method for Manufacturing GaN-Based Light Emitting Diode Element of Embodiment 7)

Now a method for manufacturing GaN-based light emitting diode elements according to embodiments of the present invention will be described using a case of manufacturing the GaN-based light emitting diode element 101 of Embodiment 7 as an example. The GaN-based light emitting diode element 101 can be manufactured by sequentially executing steps (A) to (G) to be described below.

(A) Preparation of Epi-Wafer

Figure 21A:
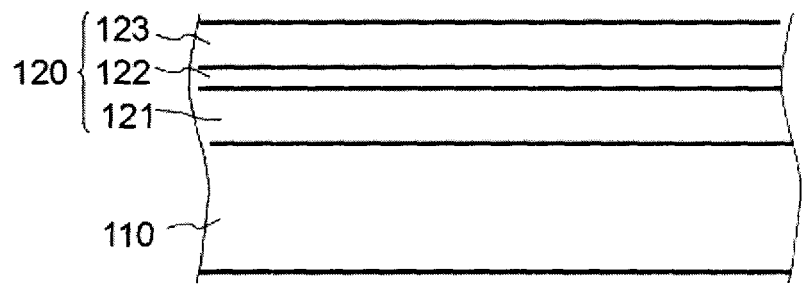
FIG. 21 is a cross-sectional view depicting steps of the manufacturing method of the present invention.

In the first step, as shown in FIG. 21A, an epi-wafer, where the epi-layer 120, including the n-type layer 121, the active layer 122 and the p-type layer 123 formed of a GaN-based semiconductor, is formed on the n-type conductive m-plane GaN substrate 110, is prepared. In this step the thickness of the substrate 110 is typically 300 μm to 1 mm.

(B) Processing of Epi-Layer

Figure 21B:
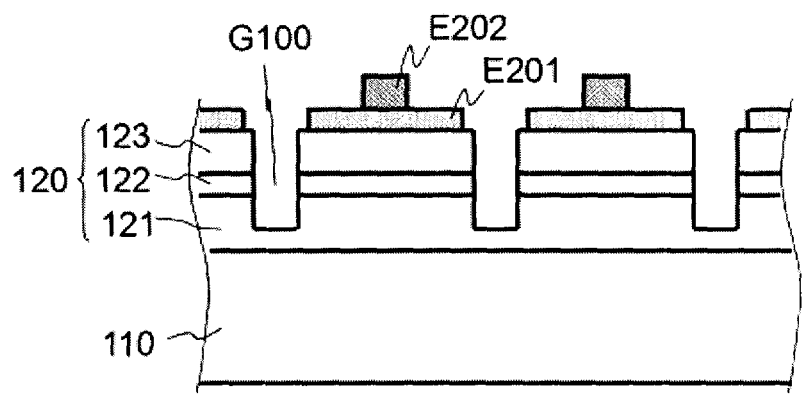

In this step, an element isolation groove G100 is formed by dry etching the epi-layer 120 as shown in FIG. 21B. Then the p-side ohmic electrode E201 and the p-side electrode pad E202 are sequentially formed on the p-type layer 123 of each light emitting diode portion separated by the element isolation groove G100. The sequence of forming the element isolation groove G100 and the p-side ohmic electrode E201 is not limited to the above sequence, but the p-side ohmic electrode E201 may be formed before forming the element isolation groove G100. In this example, the element isolation groove G100 has a depth reaching the n-type layer 121, but may have a depth reaching the surface or inside of the substrate 110. It is preferable that, after forming the element isolation groove G100, the p-side ohmic electrode E201 and the p-side ohmic electrode pad E202, the surface of the p-side ohmic electrode E201 and the exposed surface of the epi-layer are coated with an insulating protective film formed of such a transparent material as $SiO_2$ or $SiN_x$ (not illustrated).

(C) Thinning of Substrate

Figure 21C:
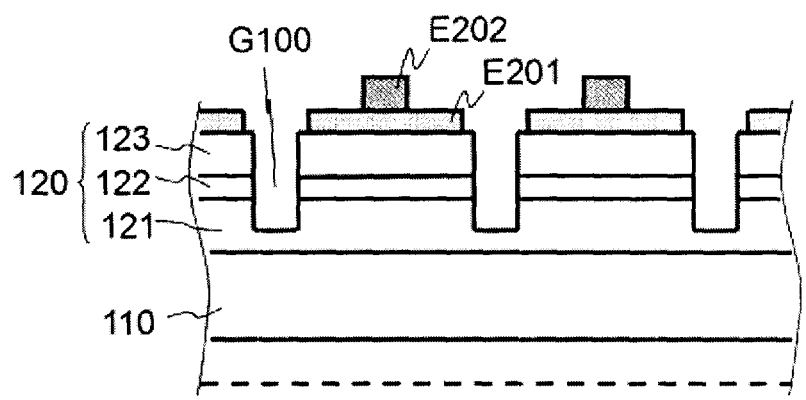

In this step, the thickness of the substrate 110 is decreased as shown in FIG. 21C by grinding or lapping the rear face of the substrate 110. In the case of grinding, lapping is performed thereafter so as to reduce the roughness of the processed surface. During lapping, it is preferable that the particle size of the diamond abrasive grain to be used is decreased in steps.

Step (C) is performed if necessary, and may be omitted.

(D) Polishing of Rear Face of Substrate

In this step, the rear face of the substrate 110 is polished using an acidic CMP slurry at low polishing rate of a 0.5 μm/h or less, so that the arithmetic mean roughness Ra in a range of 10 μm squares measured by AFM is 0.1 nm or less. The pH of the CMP slurry is preferably less than 2. If the rear face of the substrate 110 before polishing is rough like an as-ground surface, the polishing is performed after reducing the roughness by performing lapping as a pre-treatment. During this lapping, it is preferable that the particle size of the diamond abrasive grain to be used is decreased in steps. After polishing, slurry that adhered to the substrate 110 is washed off by water, and the substrate 110 is dried. After the washing, organic cleaning or ultraviolet ozone cleaning may be performed.

(E) Formation of n-Side Electrode

Figure 22D:
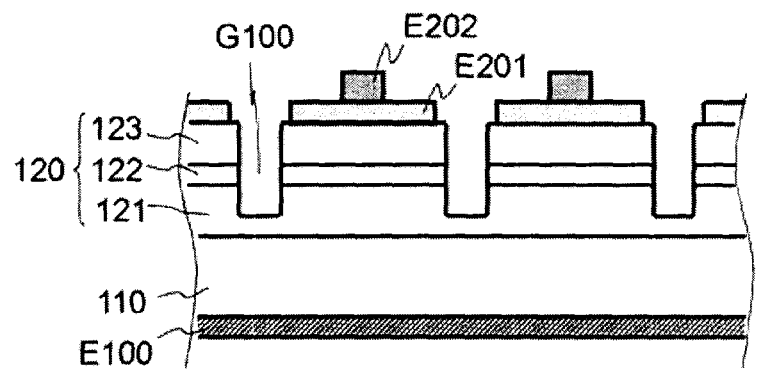
FIG. 22 is a cross-sectional view depicting steps of the manufacturing method of the present invention.

In this step, a thin film of the n-side electrode E100, as shown in FIG. 22d, is formed on the entire rear face of the substrate 110 using such a vapor phase method as evaporation, sputtering and CVD. By polishing the surface of the substrate 110 at a low rate using acidic: slurry and then forming the n-side electrode E100 directly on the surface as polished, the contact resistance of the n-side electrode E100 can be decreased.

(F) Patterning of n-Side Electrode

Figure 22E:
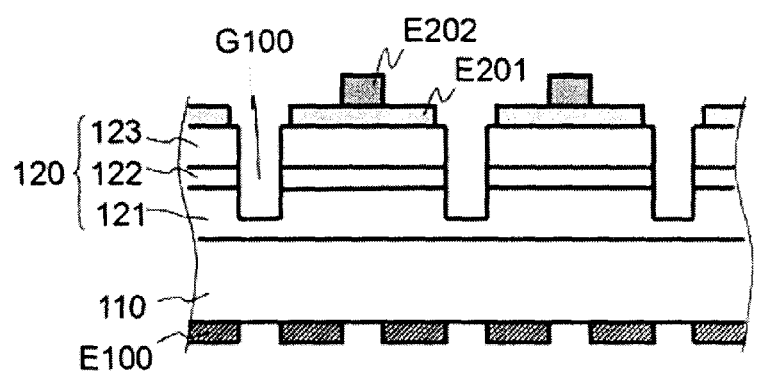

In this step, the n-side electrode E100 is patterned to be a predetermined shape as shown in FIG. 22E, by a subtractive method, that is a method of removing unnecessary portions by etching while protecting the necessary portions with a mask. The mask patterning can be performed using a well known photolithography technique. The etching method can be either one of wet etching and dry etching. The etchant used for wet etching and the etching gas used for dry etching can be appropriately selected with reference to publically known techniques. According to a preferred embodiment, after the patterning of the n-side electrode E100, the exposed surface of the substrate 110 is coated with an insulating protective film formed of such a transparent material as $SiO_2$ or $SiN_x$ (not illustrated).

(G) Dicing

Figure 22F:
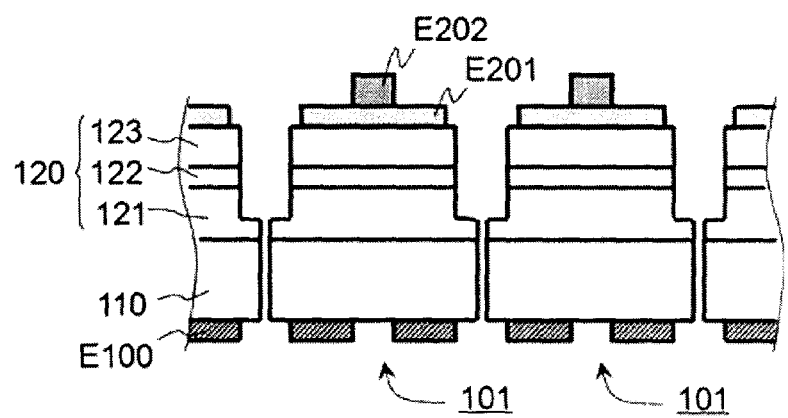

As a final step, the epi-wafer is separated at the positions of the element isolation grooves G100 formed on the epi-layer 120, as shown in FIG. 22F, and chips of the GaN-based light emitting diode elements 101 are obtained.

(Method for Manufacturing GaN-Based Light Emitting Diode Element of Embodiment 8)

In the case of manufacturing the GaN-based light emitting diode element 102 according to Embodiment 8 (see FIG. 13), a step of processing the rear face of the substrate 110 to concavo-convex shape is required. This step is executed after the step of patterning the n-side electrode E100.

(Method for Manufacturing GaN-Based Light Emitting Diode Element of Embodiment 14)

In order to manufacture the GaN-based light emitting diode element 108 according to Embodiment 8 (see FIG. 19), the epi-wafer is prepared, where the epi-layer 120, including the n-type layer 121, the active layer 122 and the p-type layer 123 formed of a GaN-based semiconductor, is formed on the n-type conductive m-plane GaN substrate 110. Then the epi-layer 120 is dry etched to form the element isolation grooves G100, and the p-side electrode E200 is formed on the p-type layer 123 of each light emitting diode portion separated by the element isolation grooves G100.

After forming the p-side electrode E200, the thickness of the substrate 110 is decreased by grinding or lapping the rear face of the substrate 110. In the case of grinding, lapping is performed thereafter so as to reduce the roughness of the processed surface. Then the rear face of the substrate 110 is polished using an acidic CMP slurry at low polishing rate of a 0.5 μm/h or less, so that the arithmetic mean roughness Ra in a range of a 10 μm squares measured by AFM is 0.1 nm or less. After polishing, slurry that adhered to the substrate 110 is washed off by water, and the substrate 110 is dried. After the washing, organic cleaning or ultraviolet ozone cleaning may be performed.

Figure 23A:
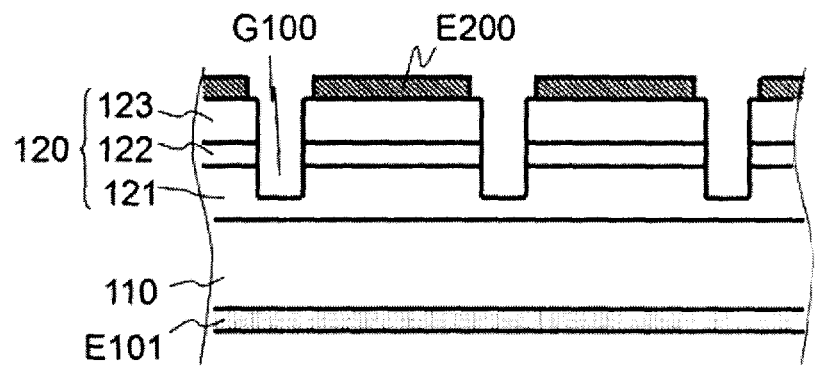
FIG. 23 is a cross-sectional view depicting steps of the manufacturing method of the present invention.

Then a thin film of the n-side ohmic electrode E101, constituted by ITO, is formed on the entire rear face of the substrate 110 as polished, using such a vapor phase method as evaporation, sputtering and CVD. FIG. 23A is a cross-sectional view of the epi-wafer when the steps thus far are completed.

Figure 23B:
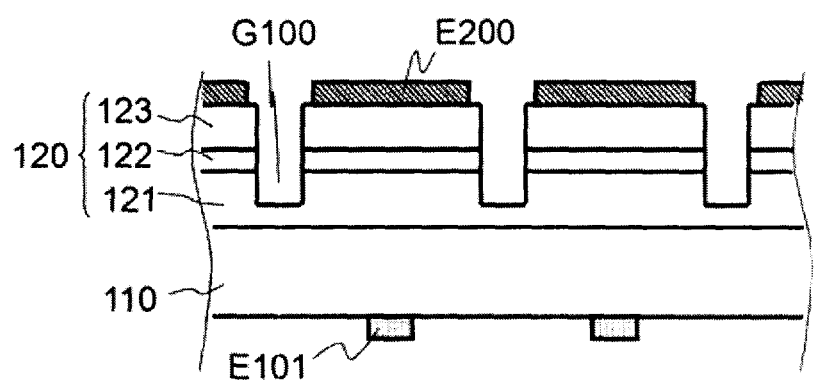

In the next step, the n-side ohmic electrode E101 is patterned to be a predetermined shape as shown in FIG. 23B, by a subtractive method, that is a method of removing unnecessary portions by etching while protecting the necessary portions with a resist mask. The resist mask patterning can be performed using a standard photolithography technique. It is preferable that the ITO is etched by wet etching using iron chloride solution or hydrochloric acid as the etchant. During the wet etching, the etching time or the like is adjusted so that unnecessary portions of ITO are not completely removed, but some remain as residue on the substrate 110.

In the case of a polycrystalline TCO thin film such as ITO, a difference between the etching rate of the crystal portion and that of the grain boundary portion during wet etching can be increased by annealing after the film formation to improve the crystallinity of the crystal portion. Therefore if the n-side ohmic electrode E101 is polycrystalline TCO film such as ITO, residue of TCO after wet etching can more easily remain on the substrate 110 by heat treating the TCO film.

Figure 23C:
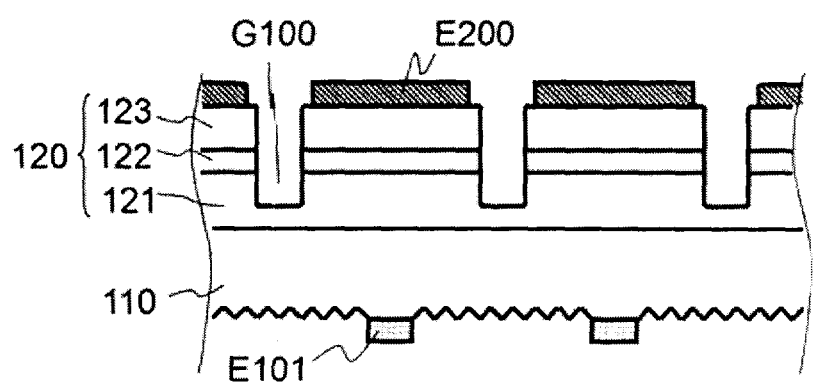

In the next step, the rear face of the exposed substrate 110 is dry etched using chlorine gas as etching gas, while continuously using the resist mask, which was used for protecting the n-side ohmic electrode E101 in the previous step, as a mask. Since the residue of ITO remaining on the substrate 110 functions as a micro-mask, countless microscopic concavoconvexs are formed in the dry etched portion of the substrate 110, as shown in FIG. 23C.

Figure 24D:
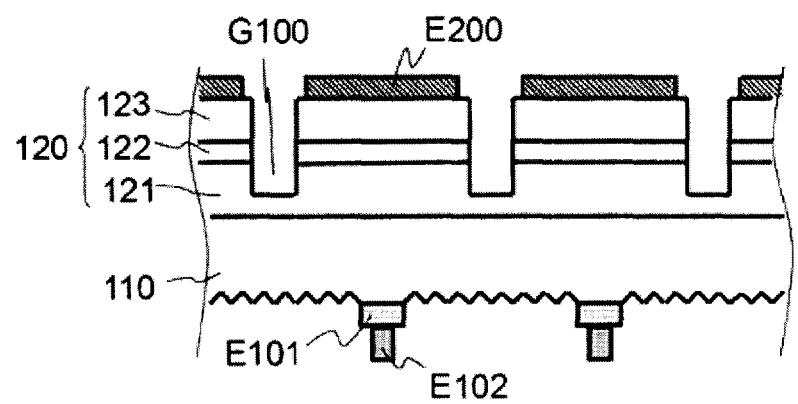
FIG. 24 is a cross-sectional view depicting steps of the manufacturing method of the present invention.
Figure 24E:
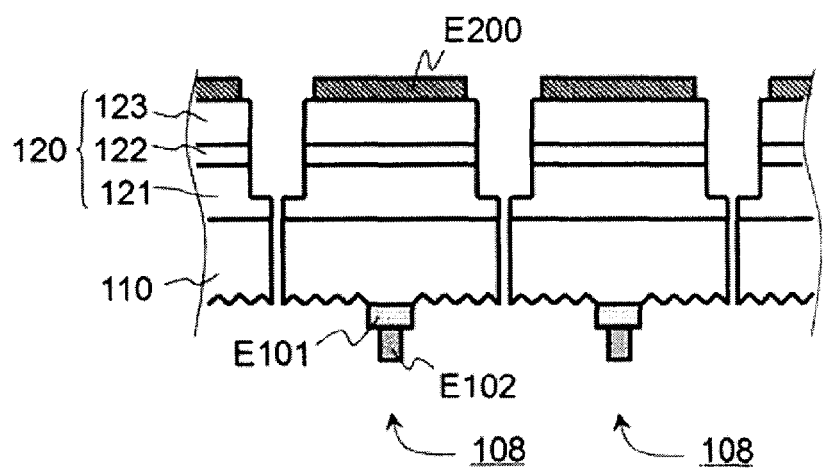

After the dry etching, the n-side electrode pad E102 is formed on the n-side ohmic electrode E101 as shown in FIG. 24D. According to a preferred embodiment, the exposed surface of the substrate 110 is coated with an insulating protective film formed of such a transparent material as $SiO_2$ or $SiN_x$ (not illustrated). Then as a final step, the epi-wafer is separated at the positions of the element isolation grooves G100 formed on the epi-layer 120 as shown in FIG. 24E, and chips of the GaN-based light emitting diode elements 108 are obtained.

Modified Embodiment

As with the above mentioned embodiments, an epi-wafer is prepared, where an epi-layer, including an n-type layer, an active layer and a p-type layer formed of a GaN-based semiconductor, is formed on the front surface of the m-plane GaN substrate, and a p-side electrode is formed on the top face of the p-type layer. Then in the case of a method for manufacturing a GaN-based light emitting diode element according to the modified embodiment, a support substrate is bonded to the epi-layer side of the epi-wafer so as to sandwich the p-side electrode.

Then the m-plane GaN substrate is abraded from the rear face side by grinding or lapping, so that the n-type layer included in the epi-layer is exposed.

Then the exposed surface of the n-type layer is polished using an acidic CMP slurry (the pH is preferably less than 2) at low polishing rate of a 0.5 μm/h or less, so that the arithmetic mean roughness Ra in a range of a 10 μm squares measured by AFM is 0.1 nm or less. After the polishing, slurry that adhered to the polished surface of the n-type layer is washed off by water, and the surface is dried. After the washing, organic cleaning or ultraviolet ozone cleaning may be performed.

Then according to the same procedure as the manufacturing method of the above embodiments, the n-side electrode is formed on the polished exposed surface of the n-type layer, and is patterned.

The n-type electrode formed like this should have a low contact resistance to the n-type layer.

DISCLOSURE OF OTHER INVENTION

It will be apparent to those skilled in the art that the following invention on a surface treatment method, a method for manufacturing a semiconductor element, and a GaN-based light emitting diode element are disclosed in the present description.

(a1) A surface treatment method for an m-plane GaN substrate, comprising: a first step of polishing a surface of the m-plane GaN substrate using an acidic CMP slurry at a 0.5 μm/h or less polishing rate; and a second step of washing the surface of the m-plane GaN substrate immediately after the first step.

(a2) The surface treatment method according to (a1), wherein the pH of the CMP slurry is less than 2.

(a3) The surface treatment method according to (a1) or (a2), wherein in the first step, the surface of the m-plane GaN substrate is polished so that the arithmetic mean roughness Ra after polishing becomes 0.1 nm or less.

(a4) A method for manufacturing a semiconductor element comprising: an electrode formation step of forming an ohmic electrode on a surface of an m-plane GaN substrate having n-type conductivity; and a surface treatment step of performing surface treatment on the surface using the surface treatment method according to any one of (a1) to (a3), as a step of finishing the surface, before starting the electrode formation step.

(a5) The method for manufacturing a semiconductor element according to (a4), wherein the carrier concentration of the m-plane GaN substrate having the n-type conductivity is $1\times10^{17}$ cm$^{-3}$.

(b1) A surface treatment method comprising: a first step of polishing an exposed m-plane of an n-type GaN-based semiconductor using an acidic CMP slurry at a 0.5 μm/h or less polishing rate; and a second step of washing the m-plane immediately after the first step.

(b2) The surface treatment method according to (b1), wherein the pH of the CMP slurry is less than 2.

(b3) The surface treatment method according to (b1) or (b2), wherein in the first step, the m-plane is polished so that the arithmetic means roughness Ra after polishing becomes 0.1 nm or less.

(b4) A method for manufacturing a semiconductor element comprising: an electrode formation step of forming an ohmic electrode on the exposed m-plane of the n-type GaN-based semiconductor; and a surface treatment step of performing surface treatment on the m-plane using the surface treatment method according to any one of (b1) to (b3), as a step of finishing the m-plane, before starting the electrode formation step.

(b5) The method for manufacturing a semiconductor element according to (b4), wherein the n-type GaN-based semiconductor is an n-type GaN-based semiconductor layer that is formed by epitaxial growth using an m-plane GaN substrate.

(c1) A GaN-based light emitting diode element comprising: a semiconductor layered body in which an n-type layer, an active layer and a p-type layer, formed of a GaN-based semiconductor, are layered in this sequence, and the layering direction thereof is parallel with the m-axis of the GaN-based semiconductor; a p-side electrode that is connected to the p-type layer; and an n-side ohmic electrode that is formed on a surface of the n-type layer on the opposite side of the active layer, wherein a forward voltage is 4.0 V or less when a forward current applied to the light emitting diode element is 20 mA.

(c2) A GaN-based light emitting diode element comprising: a semiconductor layered body in which an n-type layer, an active layer and a p-type layer, formed of a GaN-based semiconductor, are layered in this sequence, and the layering direction thereof is parallel with the m-axis of the GaN-based semiconductor; a p-side electrode that is connected to the p-type layer; and an n-side ohmic electrode that is formed on a surface of the n-type layer on the opposite side of the active layer, wherein a forward voltage is 4.5 V or less when a forward current applied to the light emitting diode element is 60 mA.

(c3) A GaN-based light emitting diode element comprising: a semiconductor layered body in which an n-type layer, an active layer and a p-type layer, formed of a GaN-based semiconductor, are layered in this sequence, and the layering direction thereof is parallel with the m-axis of the GaN-based semiconductor; a p-side electrode that is connected to the p-type layer; and an n-side ohmic electrode that is formed on a surface of the n-type layer on the opposite side of the active layer, wherein a forward voltage is 5.0 V or less when a forward current applied to the light emitting diode element is 120 mA.

(c4) A GaN-based light emitting diode element comprising: a semiconductor layered body in which an n-type layer, an active layer and a p-type layer, formed of a GaN-based semiconductor, are layered in this sequence, and the layering direction thereof is parallel with the m-axis of the GaN-based semiconductor; a p-side electrode that is connected to the p-type layer; and an n-side ohmic electrode that is formed on a surface of the n-type layer on the opposite side of the active layer, wherein a forward voltage is 5.5 V or less when a forward current applied to the light emitting diode element is 200 mA.

(c5) A GaN-based light emitting diode element comprising: a semiconductor layered body in which an n-type layer, an active layer and a p-type layer, formed of a GaN-based semiconductor, are layered in this sequence, and the layering direction thereof is parallel with the m-axis of the GaN-based semiconductor; a p-side electrode that is connected to the p-type layer; and an n-side ohmic electrode that is formed on a surface of the n-type layer on the opposite side of the active layer, wherein a forward voltage is 6.0 V or less when a forward current applied to the light emitting diode element is 350 mA.

(c6) The GaN-based light emitting diode element according to any one of (c1) to (c5), wherein an area of the surface of the n-type layer on the side where the n-side ohmic electrode is formed is 0.0012 cm$^2$ or more.

(c7) The GaN-based light emitting diode element according to (c6), wherein an area of the n-side ohmic electrode is 0.0012 cm$^2$ or more, and equal to or less than the area of the surface of the n-type layer on the side where the n-side ohmic electrode is formed.

(c8) The GaN-based light emitting diode element according to any one of (c1) to (c7), wherein an arithmetic mean roughness Ra in a range of 10 μm squares at least in a portion to contact with the n-side ohmic electrode of the surface of the n-type layer is 0.1 nm or less.

CLAIM SCOPE AND INCORPORATED BY REFERENCE

While the invention has been described in detail and with reference to specific embodiments thereof, it will be apparent to one skilled in the art that various changes and modifications can be made therein without departing from the spirit and scope thereof.

EXPLANATION OF REFERENCE NUMERALS 100, 101, 102, 103, 104, 105, 106, 107, 108, 109 GaN-based light emitting diode element
110 substrate
112a low contact resistance area
112b high contact resistance area
120 epi-layer
121 n-type layer
122 active layer
123 p-type layer
E100 n-side electrode
E101 n-side ohmic electrode
E102 n-side electrode pad
E103 auxiliary electrode
E200 p-side electrode
E201 p-side ohmic electrode
E202 p-side electrode pad
E203 auxiliary electrode
G100 element isolation groove
R100 dielectric reflection film

The invention claimed is:

1. A semiconductor light emitting element comprising:
an n-type conductive m-plane GaN substrate;
a light emitting structure which is formed of a GaN-based semiconductor, on a front face of the m-plane GaN substrate; and
an n-side ohmic electrode formed on a rear face, said rear face polished with an acidic CMP slurry, of the m-plane GaN substrate,
wherein a forward voltage is 4.0 V or less when a forward current applied to the element is 20 mA.

2. A semiconductor light emitting element comprising:
an n-type conductive m-plane GaN substrate;
a light emitting structure which is formed of a GaN-based semiconductor, on a front face of the m-plane GaN substrate; and
an n-side ohmic electrode formed on a rear face, said rear face polished with an acidic CMP slurry, of the m-plane GaN substrate,
wherein a forward voltage is 4.5 V or less when a forward current applied to the element is 60 mA.

3. A semiconductor light emitting element comprising:
an n-type conductive m-plane GaN substrate;
a light emitting structure which is formed of a GaN-based semiconductor, on a front face of the m-plane GaN substrate; and
an n-side ohmic electrode formed on a rear face, said rear face polished with an acidic CMP slurry, of the m-plane GaN substrate,
wherein a forward voltage is 5.0 V or less when a forward current applied to the element is 120 mA.

4. A semiconductor light emitting element comprising:
an n-type conductive m-plane GaN substrate;
a light emitting structure which is formed of a GaN-based semiconductor, on a front face of the m-plane GaN substrate; and
an n-side ohmic electrode formed on a rear face, said rear face polished with an acidic CMP slurry, of the m-plane GaN substrate,
wherein a forward voltage is 5.5 V or less when a forward current applied to the element is 200 mA.

5. A semiconductor light emitting element comprising:
an n-type conductive m-plane GaN substrate;
a light emitting structure which is formed of a GaN-based semiconductor, on a front face of the m-plane GaN substrate; and
an n-side ohmic electrode formed on a rear face, said rear face polished with an acidic CMP slurry, of the m-plane GaN substrate,
wherein a forward voltage is 6.0 V or less when a forward current applied to the element is 350 mA.

6. The semiconductor light emitting element according to claim 1,
wherein the light emitting structure comprises an active layer formed of a GaN-based semiconductor, an n-type GaN-based semiconductor layer disposed between the active layer and the m-plane GaN substrate, and a p-type GaN-based semiconductor layer which sandwiches the active layer with the n-type GaN based semiconductor layer.

7. The semiconductor light emitting element according to claim 1,
wherein the semiconductor light emitting element is a light emitting diode element.

8. The semiconductor light emitting element according to claim 1, wherein an area of the rear face of the m-plane GaN substrate is 0.0012 cm$^2$ or more.

9. The semiconductor light emitting element according to claim 8, wherein an area of the n-side ohmic electrode is 0.0012 cm$^2$ or more, and equal to or less than the area of the rear face of the m-plane GaN substrate.

10. The semiconductor light emitting element according to claim 2,
wherein the light emitting structure comprises an active layer formed of a GaN-based semiconductor, an n-type GaN-based semiconductor layer disposed between the active layer and the m-plane GaN substrate, and a p-type GaN-based semiconductor layer which sandwiches the active layer with the n-type GaN based semiconductor layer.

11. The semiconductor light emitting element according to claim 2,
wherein the semiconductor light emitting element is a light emitting diode element.

12. The semiconductor light emitting element according to claim 2, wherein an area of the rear face of the m-plane GaN substrate is 0.0012 cm2 or more.

13. The semiconductor light emitting element according to claim 3,
wherein the light emitting structure comprises an active layer formed of a GaN-based semiconductor, an n-type GaN-based semiconductor layer disposed between the active layer and the m-plane GaN substrate, and a p-type GaN-based semiconductor layer which sandwiches the active layer with the n-type GaN based semiconductor layer.

14. The semiconductor light emitting element according to claim 3,
wherein the semiconductor light emitting element is a light emitting diode element.

15. The semiconductor light emitting element according to claim 3, wherein an area of the rear face of the m-plane GaN substrate is 0.0012 cm2 or more.

16. The semiconductor light emitting element according to claim 4,
wherein the light emitting structure comprises an active layer formed of a GaN-based semiconductor, an n-type GaN-based semiconductor layer disposed between the active layer and the m-plane GaN substrate, and a p-type GaN-based semiconductor layer which sandwiches the active layer with the n-type GaN based semiconductor layer.

17. The semiconductor light emitting element according to claim 4,
wherein the semiconductor light emitting element is a light emitting diode element.

18. The semiconductor light emitting element according to claim 4, wherein an area of the rear face of the m-plane GaN substrate is 0.0012 cm2 or more.

19. The semiconductor light emitting element according to claim 5,
wherein the light emitting structure comprises an active layer formed of a GaN-based semiconductor, an n-type GaN-based semiconductor layer disposed between the active layer and the m-plane GaN substrate, and a p-type GaN-based semiconductor layer which sandwiches the active layer with the n-type GaN based semiconductor layer.

20. The semiconductor light emitting element according to claim 5,
wherein the semiconductor light emitting element is a light emitting diode element.

21. The semiconductor light emitting element according to claim 5, wherein an area of the rear face of the m-plane GaN substrate is 0.0012 cm2 or more.

22. The semiconductor light emitting element according to claim 1, wherein the n-side ohmic electrode has a layered structure comprising a first portion which contacts the substrate formed of at least one metal selected from the group consisting of Ti, Cr, V, W, or ITO, and a second portion which is formed of at least one metal selected from the group consisting of Au, Cu or Ag.

* * * * *